US011901631B2

(12) United States Patent
Jang et al.

(10) Patent No.: US 11,901,631 B2
(45) Date of Patent: Feb. 13, 2024

(54) ELECTRONIC DEVICE INCLUDING ROLLABLE DISPLAY

(71) Applicant: Samsung Electronics Co., Ltd., Suwon-si (KR)

(72) Inventors: Kyihyun Jang, Suwon-si (KR); Sumin Yun, Suwon-si (KR); Kyunggu Kim, Suwon-si (KR); Kyungmoon Seol, Suwon-si (KR); Jinwoo Jung, Suwon-si (KR); Jaebong Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 254 days.

(21) Appl. No.: 17/532,070

(22) Filed: Nov. 22, 2021

(65) Prior Publication Data

US 2022/0149542 A1 May 12, 2022

Related U.S. Application Data

(63) Continuation of application No. PCT/KR2021/016124, filed on Nov. 8, 2021.

(30) Foreign Application Priority Data

Nov. 11, 2020 (KR) ........................ 10-2020-0150402
Jan. 11, 2021 (KR) ........................ 10-2021-0003171

(51) Int. Cl.
*H01Q 1/24* (2006.01)
*H01Q 21/06* (2006.01)
(Continued)

(52) U.S. Cl.
CPC ........... *H01Q 21/06* (2013.01); *H01Q 1/2283* (2013.01); *H01Q 1/24* (2013.01); *H01Q 1/526* (2013.01);
(Continued)

(58) Field of Classification Search
CPC ........ H01Q 21/06; H01Q 1/2283; H01Q 1/24; H01Q 1/526; H01Q 9/0407; H01Q 9/16; H01Q 15/14; H05K 5/0017; H05K 9/0024
See application file for complete search history.

(56) References Cited

U.S. PATENT DOCUMENTS 11,171,088 B2 * 11/2021 Tang ................. H01L 23/53228
2013/0241795 A1 9/2013 Sung et al.
(Continued)

FOREIGN PATENT DOCUMENTS

JP 11-272205 10/1999
JP 2008-171148 7/2008
(Continued)

OTHER PUBLICATIONS

Search Report and Written Opinion dated Feb. 16, 2022 in counterpart International Patent Application No. PCT/KR2021/016124.

*Primary Examiner* — Dieu Hien T Duong
(74) *Attorney, Agent, or Firm* — Nixon & Vanderhye, P.C.

(57) ABSTRACT

An electronic device according to various embodiments may include: a column-shaped housing including a processor and a communication module comprising communication circuitry disposed therein; a rollable display wound on a column face of the housing, wherein a printed circuit board is disposed on the housing; an array antenna mounted or embedded on the printed circuit board as a module; and a director unit including at least one director comprising a conductive material corresponding to a beam being formed by the array antenna and disposed on at least a part of the rollable display in a state in which the rollable display is wound.

20 Claims, 32 Drawing Sheets

(51) Int. Cl.

| | |
|---|---|
| ***H01Q 1/22*** | (2006.01) |
| ***H01Q 9/04*** | (2006.01) |
| ***H01Q 9/16*** | (2006.01) |
| ***H05K 5/00*** | (2006.01) |
| ***H01Q 1/52*** | (2006.01) |
| ***H05K 9/00*** | (2006.01) |
| ***H01Q 15/14*** | (2006.01) |

(52) U.S. Cl.
CPC ............. *H01Q 9/0407* (2013.01); *H01Q 9/16* (2013.01); *H01Q 15/14* (2013.01); *H05K 5/0017* (2013.01); *H05K 9/0024* (2013.01)

(56) References Cited

U.S. PATENT DOCUMENTS

| | | | | |
|---|---|---|---|---|
| 2014/0347827 | A1 | 11/2014 | Lee et al. | |
| 2017/0309991 | A1 | 10/2017 | Noori et al. | |
| 2017/0329368 | A1 | 11/2017 | Rho et al. | |
| 2018/0198899 | A1 | 7/2018 | Lee | |
| 2019/0229413 | A1 | 7/2019 | Jong et al. | |
| 2021/0219437 | A1 | 7/2021 | Kim et al. | |
| 2021/0363820 | A1* | 11/2021 | Friman .................. | H02K 11/33 |

FOREIGN PATENT DOCUMENTS

| | | |
|---|---|---|
| KR | 10-2013-0106078 | 9/2013 |
| KR | 10-2014-0139254 | 12/2014 |
| KR | 10-2016-0048690 | 5/2016 |
| KR | 10-2016-0136587 | 11/2016 |
| KR | 10-2017-0006089 | 1/2017 |
| KR | 10-2019-0090292 | 8/2019 |
| KR | 10-2019-0143029 | 12/2019 |

* cited by examiner

Theta 90(X-Y Plane)

Phi 90(Y-Z Plane)

Frequency = 26 GHz
Main lobe magnitude = 5.82 dBi
Main lobe direction = 270.0 deg.
Angular width (3 dB) = 22.3 deg.
Side lobe level = -13.9 dB (1801)

Frequency = 26 GHz
Main lobe magnitude = 11.5 dBi
Main lobe direction = 27.0 deg.
Angular width (3 dB) = 88.2 deg.
Side lobe level = -27.3 dB (1803)

Theta 90(X-Y Plane)

Farfield Realized Gain Abs (Theta=90)

Phi / Degree vs. dBi

Frequency = 26 GHz
Main lobe magnitude = 10.9 dBi
Main lobe direction = 270.0 deg.
Angular width (3 dB) = 23.7 deg.
Side lobe level = -17.2 dB

[1901]

Phi 90(Y-Z Plane)

Farfield Realized Gain Abs (Phi=90)

Theta / Degree vs. dBi

Frequency = 26 GHz
Main lobe magnitude = 13.7 dBi
Main lobe direction = 58.0 deg.
Angular width (3 dB) = 58.5 deg.
Side lobe level = -10.8 dB

[1903]

Theta 90(X-Y Plane)

Farfield Realized Gain Abs (Theta=90)

Phi 90(Y-Z Plane)

Farfield Realized Gain Abs (Phi=90)

Phi / Degree vs. dBi

Frequency = 26 GHz
Main lobe magnitude = 10.5 dBi
Main lobe direction = 270.0 deg.
Angular width (3 dB) = 23.5 deg.
Side lobe level = -17.2 dB (2001)

Theta / Degree vs. dBi

Frequency = 26 GHz
Main lobe magnitude = 14 dBi
Main lobe direction = 53.0 deg.
Angular width (3 dB) = 60.5 deg.
Side lobe level = -18.9 dB (2003)

[2201]

[2203]

Theta 90(X-Y Plane)

Farfield Realized Gain Abs (Theta=90)

Phi / Degree vs. dBi

Frequency = 26 GHz
Main lobe magnitude = 10.9 dBi
Main lobe direction = 271.0 deg.
Angular width (3 dB) = 23.6 deg.
Side lobe level = -14.8 dB

[2301]

Phi 90(Y-Z Plane)

Farfield Realized Gain Abs (Phi=90)

Theta / Degree vs. dBi

Frequency = 26 GHz
Main lobe magnitude = 13.7 dBi
Main lobe direction = 57.0 deg.
Angular width (3 dB) = 58.6 deg.
Side lobe level = -11.0 dB

[2303]

ELECTRONIC DEVICE INCLUDING ROLLABLE DISPLAY

CROSS-REFERENCE TO RELATED APPLICATIONS

This application is a continuation of International Application No. PCT/KR2021/016124 designating the United States, filed on Nov. 8, 2021, in the Korean Intellectual Property Receiving Office and claiming priority to Korean Patent Application No. 10-2020-0150402, filed on Nov. 11, 2020, in the Korean Intellectual Property Office and Korean Patent Application No. 10-2021-0003171, filed on Jan. 11, 2021, in the Korean Intellectual Property Office, the disclosures of all of which are incorporated by reference herein in their entireties.

BACKGROUND

Field

The disclosure relates to an electronic device including a rollable display.

Description of Related Art

In general, a display device using a display panel, such as a liquid crystal display device, an organic light-emitting display device, a light-emitting diode display device, or an electrophoretic display device, has mainly been applied to a notebook computer, a portable electronic device, a television, or a monitor.

A rollable display that is bendable using a flexible substrate having flexibility has received attention as a new display.

In an electronic device including a rollable display, it may be difficult to secure the performance of an antenna since at least a part of a radiation area of the antenna is hidden by the display.

SUMMARY

Embodiments of the disclosure provide an electronic device including a rollable display that can secure an antenna gain even if an antenna area is hidden by the rollable display.

An electronic device according to various example embodiments may include: a column-shaped housing including a processor and a communication module comprising communication circuitry disposed therein; a rollable display wound on a column face of the housing, wherein a printed circuit board is disposed on the housing; an array antenna mounted or embedded on the printed circuit board as a module; and a director unit comprising at least one director comprising a conductive material corresponding to a beam being formed by the array antenna and disposed on at least a part of the rollable display in a state in which the rollable display is wound.

An electronic device according to various example embodiments may include: a column-shaped housing including a processor and a communication module comprising communication circuitry disposed therein; a rollable display wound on a column face of the housing, wherein a base of the housing includes a printed circuit board; an array antenna disposed in a bezel area of the rollable display and/or in a multi-bar of the rollable display; and a director unit comprising at least one director comprising a conductive material disposed in at least a part of an area corresponding to a beam being formed by the array antenna in a state in which the rollable display is wound.

The electronic device including the rollable display according to various example embodiments of the disclosure, a conductive member is disposed in at least a partial area of the rollable display adjacent to the antenna, and thus the gain of the antenna can be secured.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
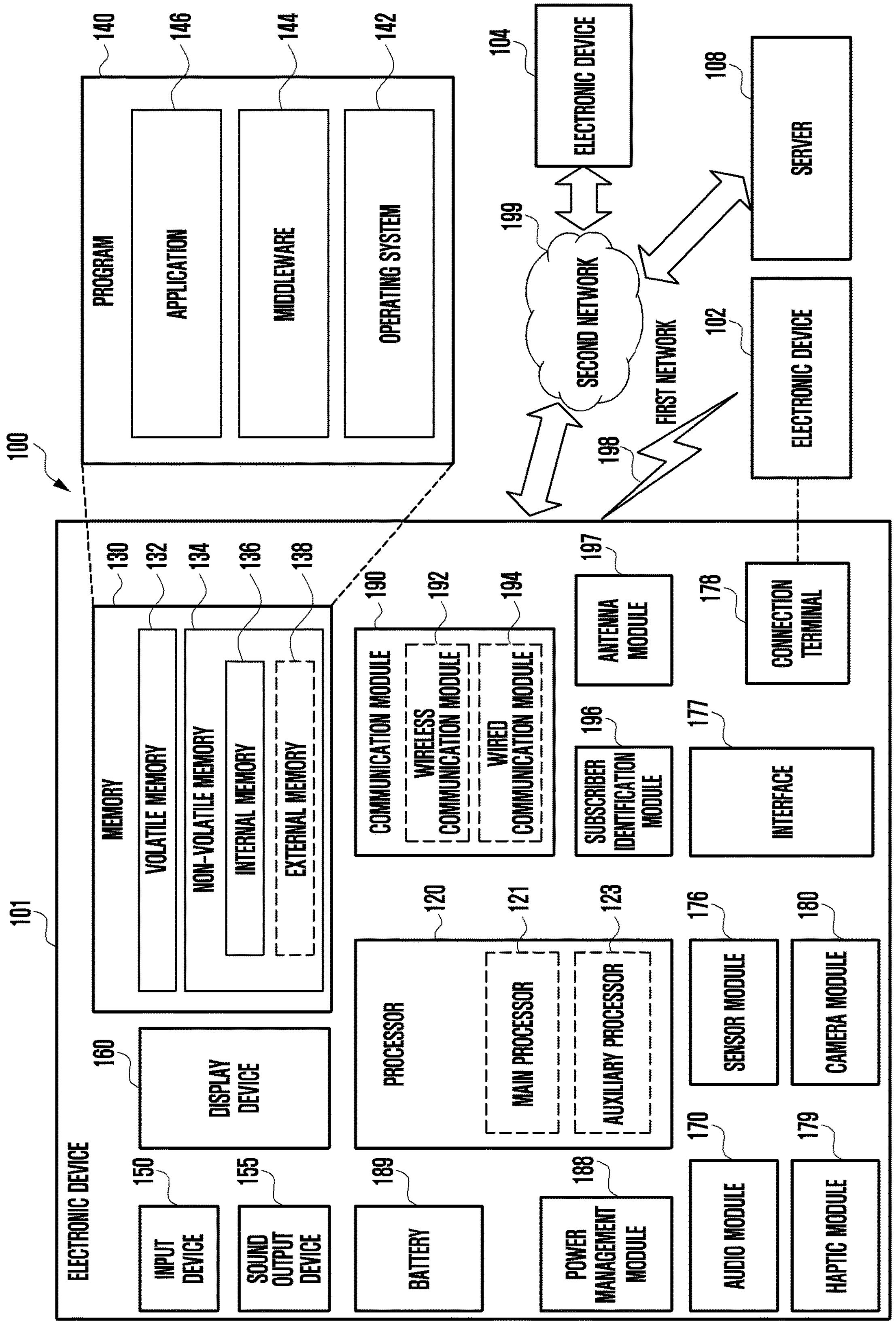
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
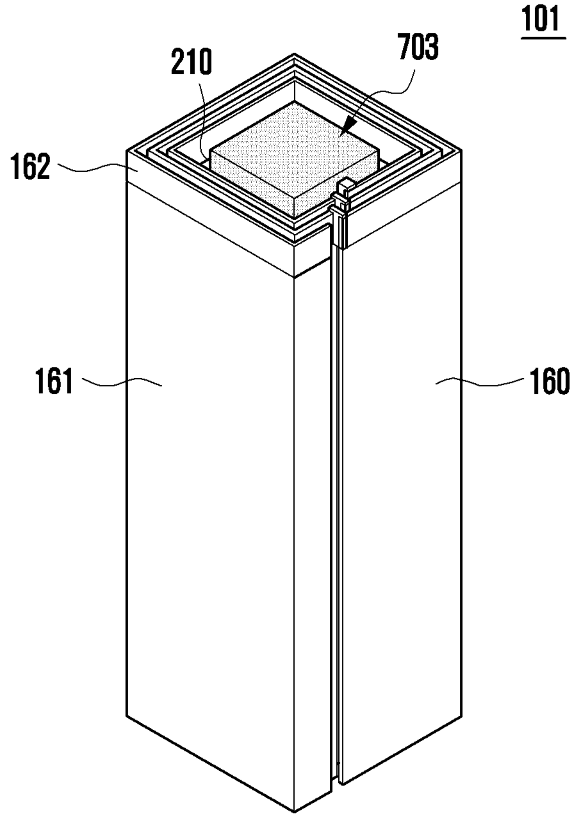
FIG. 2 is a perspective view of an electronic device according to various embodiments.

FIG. 2 is a perspective view of an electronic device 101 according to various embodiments.

Figure 3:
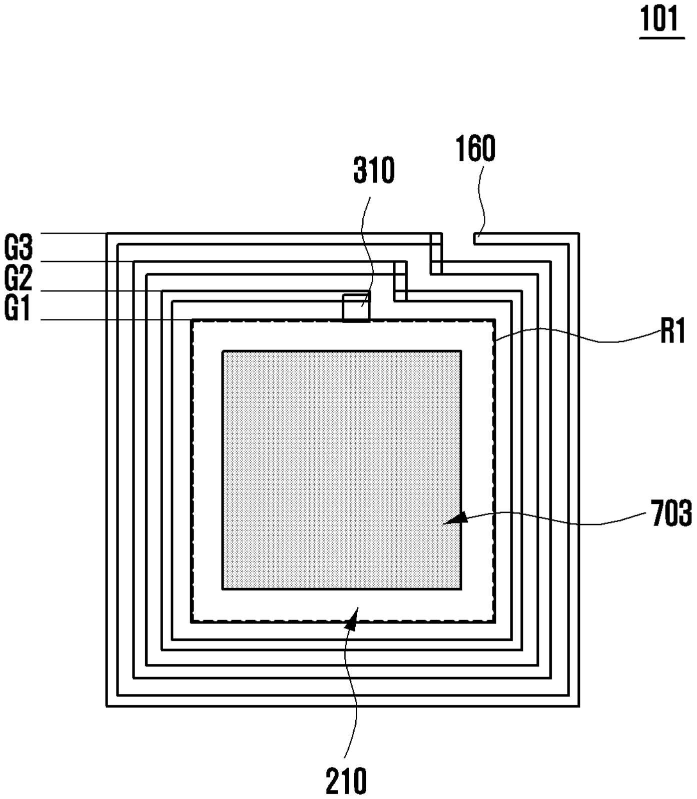
FIG. 3 is a diagram illustrating an example electronic device according to various embodiments.

FIG. 3 is a diagram illustrating an electronic device 101 according to various embodiments.

Figure 4:
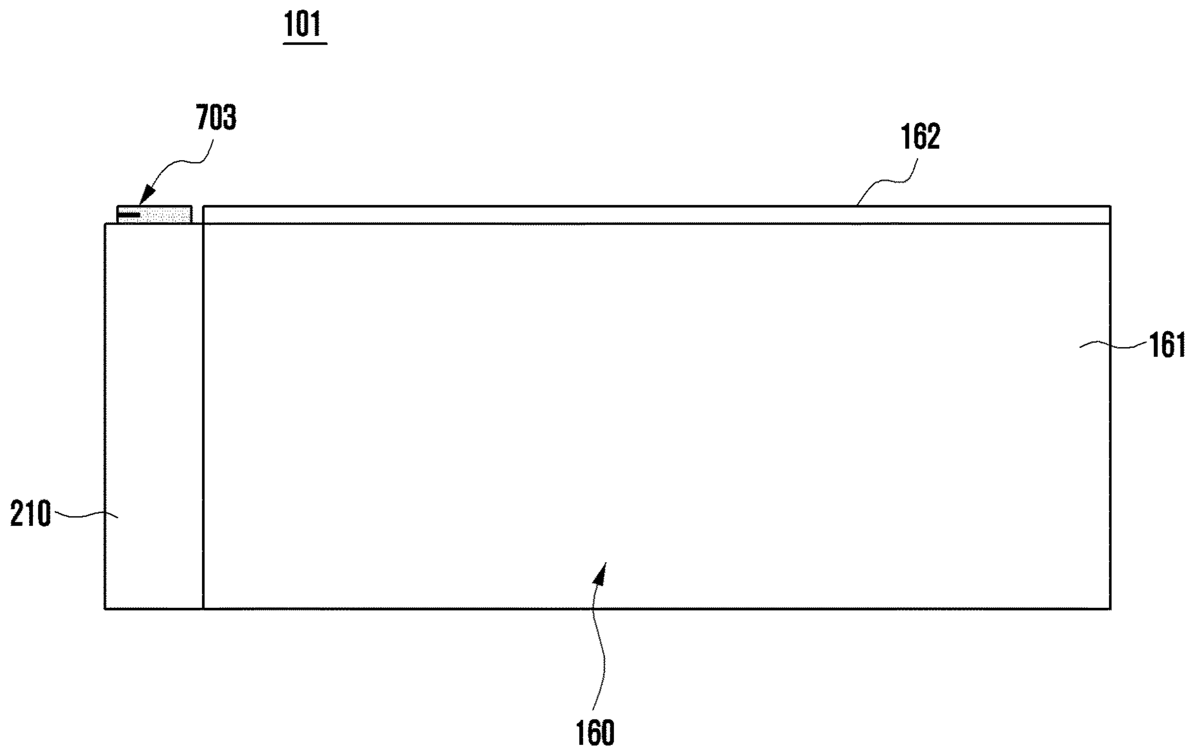
FIG. 4 is a diagram illustrating an example electronic device in a state where a display module is unfolded according to various embodiments.

FIG. 4 is a diagram illustrating an electronic device 101 in a state where a display module 160 is unfolded according to various embodiments.

An electronic device 101 may include a display module 160 and a housing 210.

According to various embodiments, the housing 210 may be in the shape of a prism and a cylinder. The housing 210 may include at least one of elements of the electronic device 101. In various embodiments, the housing 210 may include therein a processor 120, a memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module 196, and/or antenna module 197.

In various embodiments, the display module 160 may be a rollable display. The rollable display may be wound on an outside of the housing 210 in the form of a roll. In case of being wound on the outside of the housing 210 in the form of a scroll, the display module 160 may be wound while forming a layer such as a tree ring.

In various embodiments, the display module 160 may form at least one layer, and may be wound on the outside of the housing 210.

In various embodiments, referring to FIG. 2 or 3, three layers may be formed when the display module 160 is wound on the outside of the housing 210, but are not limited thereto.

In various embodiments, when the display module 160 is wound on the outside of the housing 210, the length of an interval between the layers may be a first length G1, a second length G2, or a third length G3. For example, the first length G1, the second length G2, or the third length G3 may be substantially the same length, or may be different from one another.

In various embodiments, the display module 160, when being unfolded, may be a flat display, and may be substantially in the shape of a rectangle. The electronic device 160 may fix at least one side (e.g., portrait side) of the display module 160 to the housing 210 using a fixing member 310. The display module 160 may be fixed to the housing 210 by the fixing member 310 to be wound or unwound.

In various embodiments, the display module 160 may include a display area 161 and a bezel area 162. The display area 161 (active area) may be an area on which an image is displayed, and the bezel area 162 may be a dead space. A structure, such as an antenna element, may be disposed in the bezel area 162.

In various embodiments, at least one side (e.g., base of a prism or a cylinder) of the housing 210 may include a ground 703. The ground 703 may operate as a reflector, and may include a pattern for operating as the reflector. The ground 703 may be a conductor.

Figure 5:
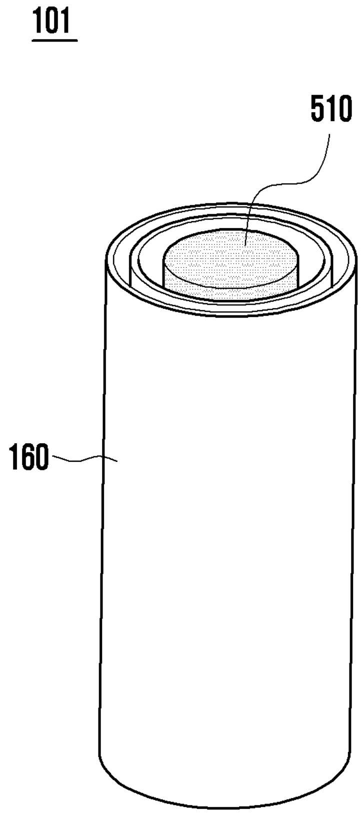
FIG. 5 is a perspective view of an electronic device according to various embodiments.

FIG. 5 is a perspective view of an electronic device 101 according to various embodiments.

Figure 6:
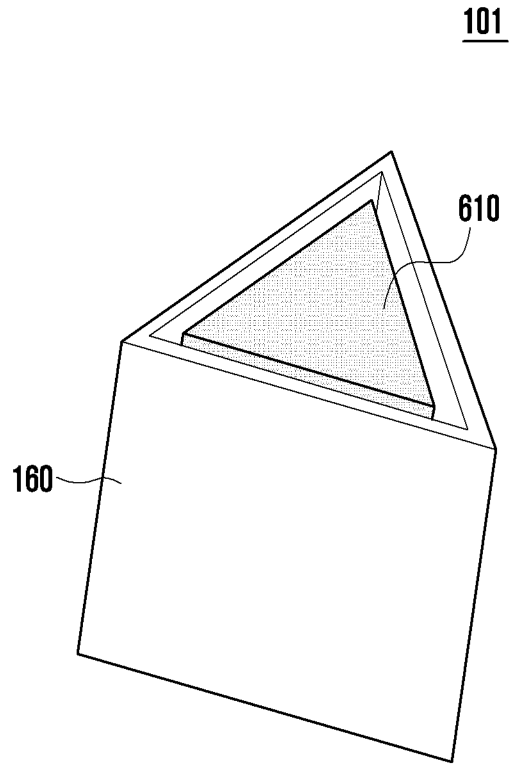
FIG. 6 is a perspective view of an electronic device according to various embodiments.

FIG. 6 is a perspective view of an electronic device 101 according to various embodiments.

A housing 510 of an electronic device 101 of FIG. 5 may be in the shape of a cylinder, and a housing 610 of an electronic device 101 of FIG. 6 may be in the form of a triangular prism. The housing of the electronic device 101 may be in various shapes of column, prism, and cylinder.

Figure 7:
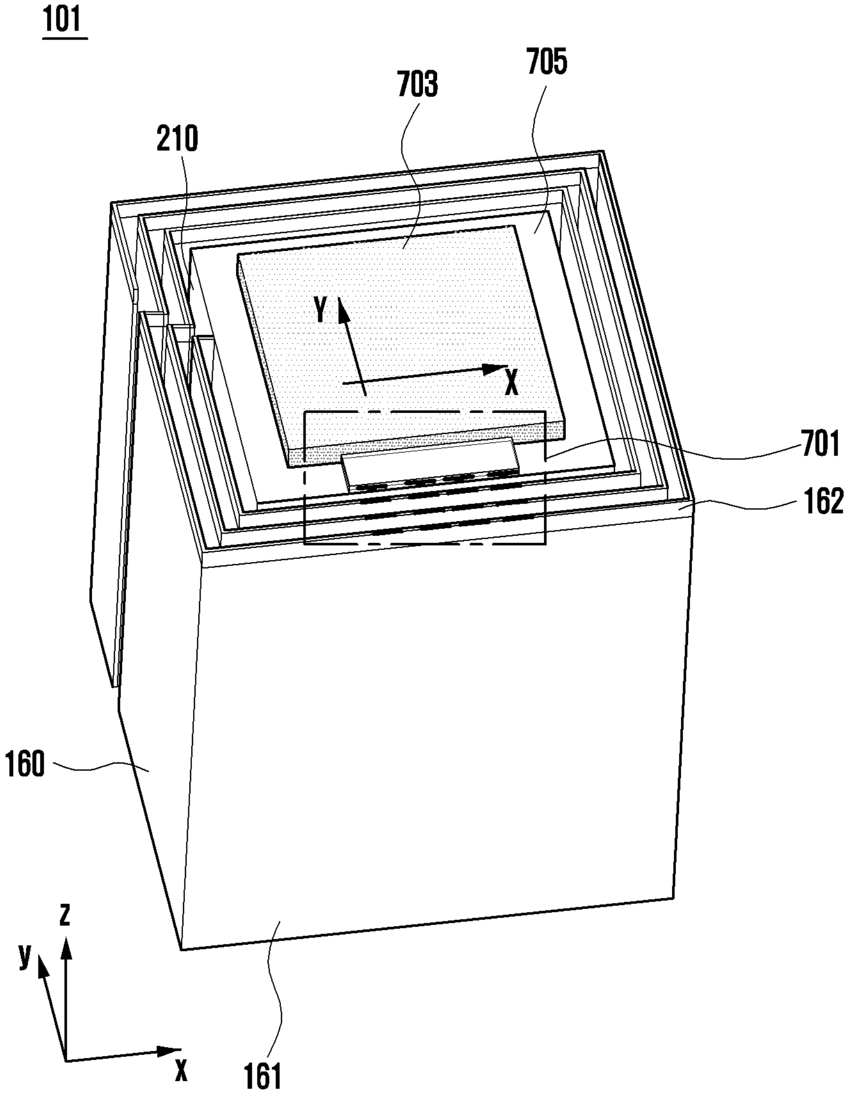
FIG. 7 is a perspective view illustrating an electronic device including an antenna according to various embodiments.

FIG. 7 is a perspective view illustrating an electronic device 101 including an antenna structure 701 according to various embodiments.

Figure 8:
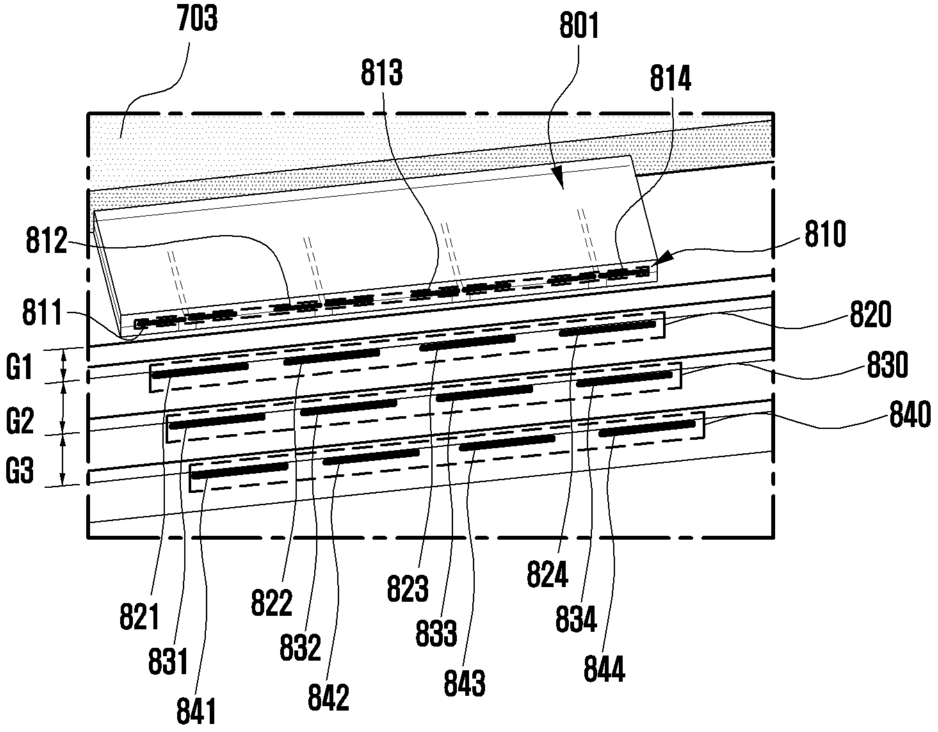
FIG. 8 is a diagram illustrating the antenna of FIG. 7 according to various embodiments.

FIG. 8 is a diagram illustrating the antenna structure 701 of FIG. 7 according to various embodiments.

According to various embodiments, an electronic device 101 may include an antenna module 801, at least one director unit 820, 830, and 840, and/or a ground 703. The antenna module 801 may include an array antenna 810.

In various embodiments, the electronic device 101 may include the array antenna 810 and/or the at least one director unit 820, 830, and 840.

In various embodiments, the array antenna 810, the at least one director unit 820, 830, and 840, and the ground 703 may include a conductive material.

In various embodiments, the electronic device 101 may include the array antenna 810 on at least a part of the housing 201. The display module 160 may include the at least one director unit 820, 830, and 840 on at least a part of the bezel area 162.

The array antenna 810 may include at least one antenna 811, 812, 813, and 814.

The first director unit 820 may include at least one director 821, 822, 823, and 824. The second director unit 830 may include at least one director 831, 832, 833, and 834. The third director unit 840 may include at least one director 841, 842, 843, and 844.

In various embodiments, the housing 210 may be in the shape of a column (prism or cylinder) on which the display module 160 is wound in the form of a roll, and may include a face on which the display module 160 is wound in the form of a roll, and a first side and a second side on which the printed circuit board 705 can be disposed. In the electronic device 101, the printed circuit board 705 may be disposed on the first side and the second side.

In various embodiments, the housing 210 may be in the shape of a prism or a cylinder, on which the display module 160 is wound in the form of a roll, and may include a face on which the display module 160 is wound in the form of a roll, and a base on which a printed circuit board 705 may be disposed. In the electronic device 101, the printed circuit board 705 may be disposed on the base. For example, the base may correspond to two sides that are in parallel to each other in a three-dimensional figure such as a cylinder or a prism.

In various embodiments, the array antenna 810 may be disposed on at least a part of the printed circuit board 705 as a module.

In various embodiments, the array antenna 810 may be embedded in at least a part of the printed circuit board 705.

In various embodiments, the array antenna 810 may be electrically connected to an RFIC that is electrically connected to the printed circuit board 705. The array antenna 810 may be disposed near at least one edge of the base on which the printed circuit board 705 is disposed so as to be able to perform emission with directivity in a direction of the side of the electronic device 101.

In various embodiments, the array antenna 810 may include at least one antenna 811, 812, 813, and 814, and each of the at least one antenna 811, 812, 813, and 814 may be connected to the RFIC of the printed circuit board 705.

In various embodiments, each of the at least one antenna 811, 812, 813, and 814 may include a feeding point, and may be connected to a feeding part of the electronic device 101 using the feeding point.

In various embodiments, the at least one antenna 811, 812, 813, and 814 may be a dipole antenna and/or a patch antenna. In FIGS. 7 and 8, it is featured that each of the at least one antenna 811, 812, 813, and 814 is a dipole antenna, but the antenna type is not limited thereto.

In various embodiments, the first antenna 811 may emit radio waves in a state where the display module 160 is wound on the housing 210. The radio waves emitted from the first antenna 811 may be emitted through a first director 821, a fifth director 831, or a ninth director 841 disposed at an interval of a first length G1, a second length G2, or a third length G3. However, the radio waves emitted from the first antenna 811 may pass through not only the first director 821, the fifth director 831, or the ninth director 841 but also other directors.

In various embodiments, the second antenna 812 may emit radio waves in a state where the display module 160 is wound on the housing 210. The radio waves emitted from the first antenna 811 may be emitted through a second director 822, a sixth director 832, or a tenth director 842 disposed at an interval of the first length G1, the second length G2, or the third length G3. However, the radio waves emitted from the second antenna 812 may pass through not only the second director 822, the sixth director 832, or the tenth director 842 but also other directors.

In various embodiments, the third antenna 813 may emit radio waves in a state where the display module 160 is wound on the housing 210. The radio waves emitted from the third antenna 813 may be emitted through a third director 823, a seventh director 833, or an eleventh director 843 disposed at an interval of the first length G1, the second length G2, or the third length G3. However, the radio waves emitted from the third antenna 813 may pass through not only the third director 823, the seventh director 833, or the eleventh director 843 but also other directors.

In various embodiments, the fourth antenna 814 may emit radio waves in a state where the display module 160 is wound on the housing 210. The radio waves emitted from the fourth antenna 814 may be emitted through a fourth director 824, an eighth director 834, or a twelfth director 844 disposed at an interval of the first length G1, the second length G2, or the third length G3. However, the radio waves emitted from the fourth antenna 814 may pass through not only the fourth director 824, the eighth director 834, or the twelfth director 844 but also other directors.

In various embodiments, the array antenna 810 may emit the radio waves to be directed in a −y-axis direction.

The ground 703 may operate to reflect the radio waves emitted from the array antenna 810 and to emit the reflected radio waves in the direction of the director units 820, 830, and 840. For example, the ground 703 may be a conductor, and may include a shield can. The ground 703 may operate as a reflector, and may include a pattern to operate as the reflector.

In various embodiments, the array antenna 810 may be disposed between the ground 703 and the director units 820, 830, and 840 in a state where the display module 160 is wound on the housing 210. The ground 703 and the array antenna 810 may be disposed on the base of the housing 210. The director units 820, 830, and 840 may be disposed in at least a part of the bezel area 162 of the display module 160 spaced apart from the array antenna 810 at an interval of the first length G1, the second length G2, or the third length G3.

In various embodiments, the array antenna 810, the at least one director unit 820, 830, and 840, and/or the ground 703 may operate as a Yagi-Uda antenna in a state where the display module 160 is wound on the housing 210.

Figure 9:
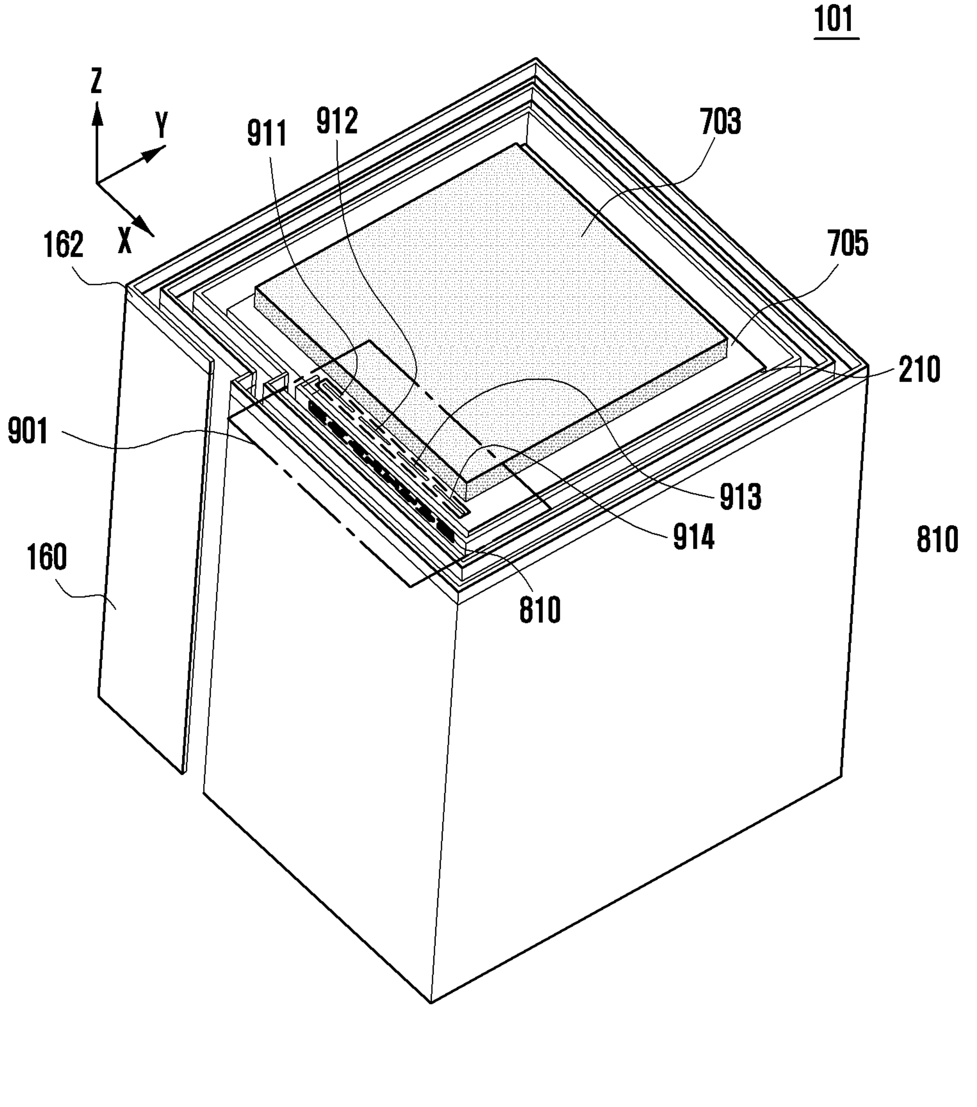
FIG. 9 is a perspective view illustrating an electronic device including an antenna according to various embodiments.
Figure 10:
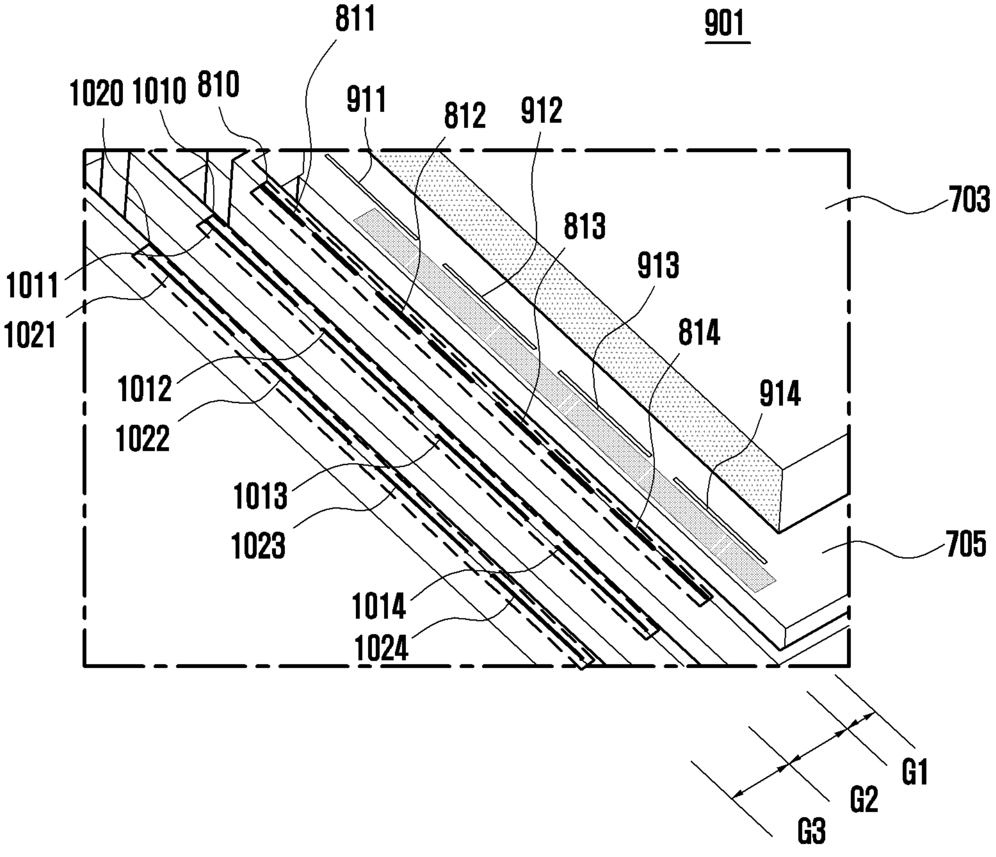
FIG. 10 is a diagram illustrating the antenna of FIG. 9 according to various embodiments.

FIG. 9 is a perspective view illustrating an electronic device 101 including an antenna 901 according to various embodiments. FIG. 10 is a diagram illustrating the antenna 901 of FIG. 9 according to various embodiments.

In various embodiments, the electronic device 101 may include the array antenna 810, at least one director unit 1010 and 1020, and/or the ground 703.

In various embodiments, the electronic device 101 may include the array antenna 810 and/or the at least one director unit 1010 and 1020.

In various embodiments, the electronic device 101 may include at least one pattern 911, 912, 913, and 914 serving as a reflector on the ground 703. The patterns 911, 912, 913, and 914 may serve as the reflector of the array antenna 810. The first pattern 911 may serve as the reflector of the first antenna 811, the second pattern 912 may serve as the reflector of the second antenna 812, the third pattern 913 may serve as the reflector of the third antenna 813, and the fourth pattern 914 may serve as the reflector of the fourth antenna 814. In the electronic device 101, the array antenna 810 may be disposed in at least a part of the bezel area 162 of the display module 160.

In various embodiments, the electronic device 101 may include a multi-bar for fixing the display module 160.

In various embodiments, in the display module 160, the at least one director unit 1010 and 1020 may be disposed on at least a part of the bezel area 162.

The array antenna 810 may include at least one antenna 811, 812, 813, and 814.

In various embodiments, the fourth director unit 1010 may include at least one director 1011, 1012, 1013, and 1014. The fifth director unit 1020 may include at least one director 1021, 1022, 1023, and 1024.

In various embodiments, the array antenna 810 may be electrically connected to an RFIC disposed on the printed circuit board 705. The array antenna 810 may include at least one antenna 811, 812, 813, and 814, and the at least one antenna 811, 812, 813, and 814 may be electrically connected to the RFIC disposed on the printed circuit board 705.

In various embodiments, the at least one antenna 811, 812, 813, and 814 may be the dipole antenna and/or the patch antenna. In FIGS. 9 and 10, it is featured that the at least one antenna 811, 812, 813, and 814 is the dipole antenna, but the antenna type is not limited thereto.

In various embodiments, the first antenna 811 may emit radio waves in a state where the display module 160 is wound on the housing 210. The radio waves emitted from the first antenna 811 may be emitted through a thirteenth director 1011 or a seventeenth director 1021 disposed at an interval of a second length G2 or a third length G3. However, the radio waves emitted from the first antenna 811 may pass through not only the thirteenth director 1011 or the seventeenth director 1021 but also other directors.

In various embodiments, the second antenna 812 may emit radio waves in a state where the display module 160 is wound on the housing 210. The radio waves emitted from the second antenna 812 may be emitted through a fourteenth director 1012 or an eighteenth director 1022 disposed at an interval of the second length G2 or the third length G3. However, the radio waves emitted from the second antenna 812 may pass through not only the fourteenth director 1012 or the eighteenth director 1022 but also other directors.

In various embodiments, the third antenna 813 may emit radio waves in a state where the display module 160 is wound on the housing 210. The radio waves emitted from the third antenna 813 may be emitted through a fifteenth director 1013 or a nineteenth director 1023 disposed at an interval of the second length G2 or the third length G3. However, the radio waves emitted from the third antenna 813 may pass through not only the fifteenth director 1013 or the nineteenth director 1023 but also other directors.

In various embodiments, the fourth antenna 814 may emit radio waves in a state where the display module 160 is wound on the housing 210. The radio waves emitted from the fourth antenna 814 may be emitted through a sixteenth director 1014 or a twentieth director 1024 disposed at an interval of the second length G2 or the third length G3. However, the radio waves emitted from the fourth antenna 814 may pass through not only the sixteenth director 1014 or the twentieth director 1024 but also other directors.

In various embodiments, the array antenna 810 may emit the radio waves to be directed in the −y-axis direction.

The ground 703 may operate to reflect the radio waves emitted from the array antenna 810 and to emit the reflected radio waves in the direction of the director units 1010 and 1020. For example, the ground 703 may be a conductor, and may be a shield can.

In various embodiments, the array antenna 810 may be disposed between the ground 703 and the director units 1010 and 1020 in a state where the display module 160 is wound on the housing 210. The ground 703 may be disposed on the base of the housing 210.

According to various embodiments, the array antenna 810 may be disposed in at least a part of the bezel area 162 of the display module 160 spaced apart from the housing 210 at an interval of the first length G1 in a state where the display module 160 is wound on the housing 210.

The director units 1010 and 1020 may be disposed in at least a part of the bezel area 162 of the display module 160 spaced apart from the array antenna 810 at an interval of the second length G2 or the third length G3 in a state where the display module 160 is wound on the housing 210.

In various embodiments, the array antenna 810, the at least one director unit 1010 and 1020, and/or the ground 703 may operate as a Yagi-Uda antenna in a state where the display module 160 is wound on the housing 210.

Figure 11:
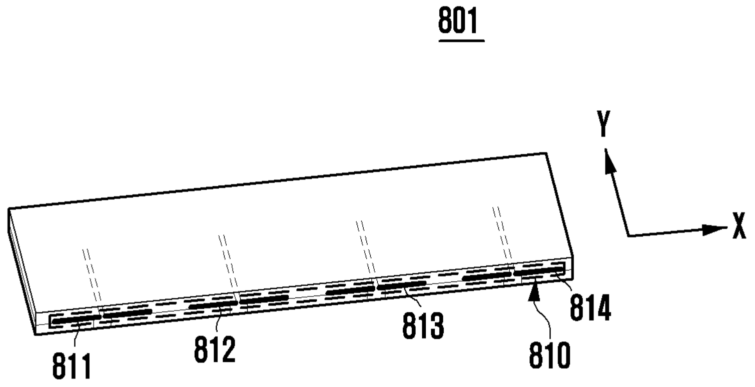
FIG. 11 is a diagram illustrating an example array antenna according to various embodiments.

FIG. 11 is a diagram illustrating an antenna module 801 according to various embodiments.

The antenna module 801 of FIG. 11 may include an array antenna 810. The array antenna 810 of FIG. 11 may be a dipole antenna, and the array antenna 810 may include at least one dipole antenna 811, 812, 813, and 814.

In various embodiments, the dipole antennas 811, 812, 813, and 814 may be disposed on at least a part of the printed circuit board 705. Each of the dipole antennas 811, 812, 813, and 814 may be embedded in the at least a part of the printed circuit board 705.

In various embodiments, the dipole antennas 811, 812, 813, and 814 may be disposed on at least a part of the bezel area 162 of the display module 160.

In various embodiments, the dipole antennas 811, 812, 813, and 814 may be disposed in at least a part of a multi-bar that fixes the display module 160.

Figure 12A:
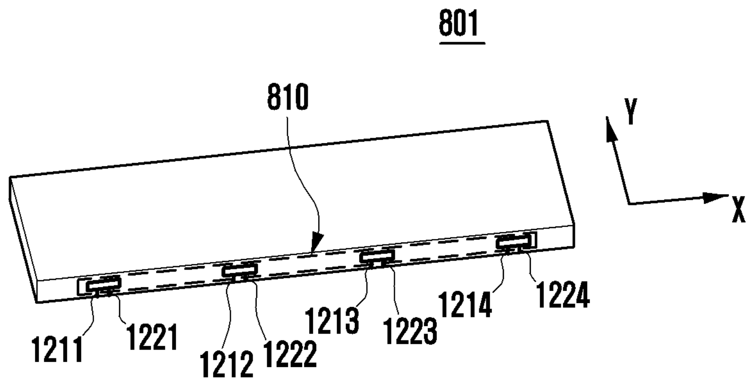
FIG. 12A is a diagram illustrating an array antenna according to various embodiments.

FIG. 12A is a diagram illustrating an array antenna 810 according to various embodiments.

The antenna module 801 of FIG. 12A may include the array antenna 810. The array antenna 810 of FIG. 12A may be a patch antenna, and the array antenna 810 may include at least one patch antenna 1211, 1212, 1213, and 1214.

In various embodiments, the patch antennas 1211, 1212, 1213, and 1214 may be disposed on at least a part of the printed circuit board 705. Each of the patch antennas 1211, 1212, 1213, and 1214 may be embedded in at least a part of the printed circuit board 705.

In various embodiments, the patch antennas 1211, 1212, 1213, and 1214 may be disposed in at least a part of the bezel area 162 of the display module 160.

In various embodiments, the patch antennas 1211, 1212, 1213, and 1214 may be disposed in at least a part of the multi-bar fixing the display module 160.

The patch antennas 1211, 1212, 1213, and 1214 may include feeding lines 1221, 1222, 1223, and 1224.

The first patch antenna 1211 may include a first feeding line 1221, the second patch antenna 1212 may include a second feeding line 1222, the third patch antenna 1213 may include a third feeding line 1223, and the fourth patch antenna 1214 may include a fourth feeding line 1224.

The patch antennas 1211, 1212, 1213, and 1214 may perform feeding through the feeding lines 1221, 1222, 1223, and 1224.

Figure 12B:
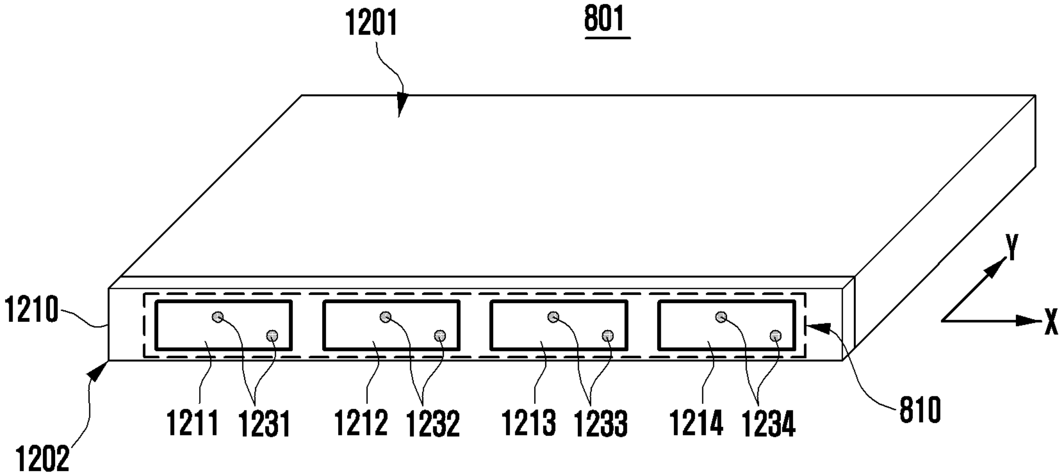
FIG. 12B is a diagram illustrating an antenna module according to various embodiments.

FIG. 12B is a diagram illustrating an antenna module 801 according to various embodiments.

In FIG. 12B, the feeding lines may be configured different from those of FIG. 12A. The antenna module 801 may include the array antenna 810. The array antenna 810 may include at least one patch antenna 1211, 1212, 1213, and 1214.

In FIG. 12B, the patch antennas 1211, 1212, 1213, and 1214 may perform feeding using probes 1231, 1232, 1233, and 1234, and may form the ground using a vertical via 1210.

In various embodiments, a first side 1201 and a second side 1202 of the antenna module 801 may be substantially perpendicular to each other. In an embodiment, the first side 1201 and the second side 1202 may be substantially in the shape of a rectangle. In an embodiment, the area of the first side 1210 may be larger than the area of the second side 1202. The array antenna 810 of FIG. 12B may be disposed on the second side 1202 of the antenna module 801.

Figure 12C:
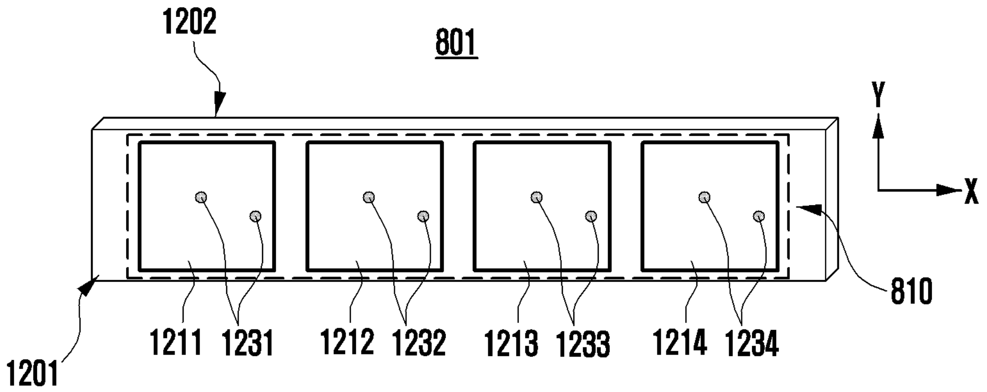
FIG. 12C is a diagram illustrating an antenna module according to various embodiments.

FIG. 12C is a diagram illustrating an antenna module 801 according to various embodiments.

With reference to FIG. 12C, the array antenna 810 may be disposed on the first side 1201. In FIG. 12C, the array antenna 810 may be disposed on the first side 1201, and in FIG. 12B, the array antenna 810 may be disposed on the second side 1202. There is a difference in disposition locations between the array antenna 810 of FIG. 12C and the array antenna 810 of FIG. 12B on the antenna module 801. The width (e.g., 4 mm) of the patch antennas 1211, 1212, 1213, and 1214 included in the array antenna 810 of FIG. 12C may be larger than the width of the patch antennas 1211, 1212, 1213, and 1214 of FIG. 12B. In an embodiment, by using a ceramic element having a high dielectric constant, the width of the patch antennas 1211, 1212, 1213, and 1214 of FIG. 12C can be minimized and/or reduced, and the patch antennas 1211, 1212, 1213, and 1214 can be disposed on at least a part of the bezel area 162 of the display module 160.

Figure 12D:
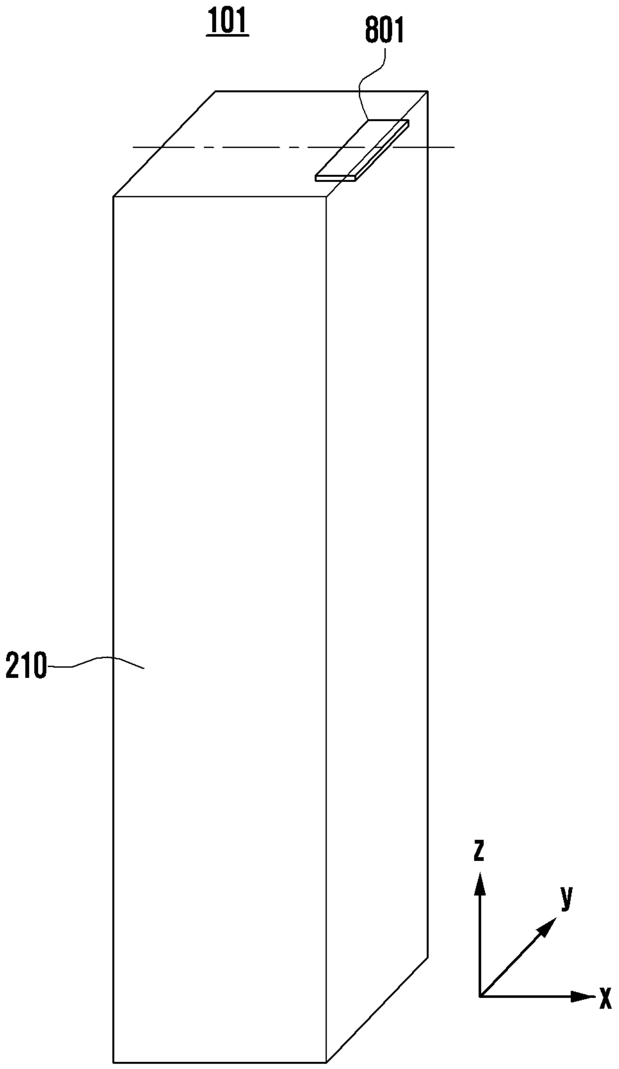
FIG. 12D is a perspective view illustrating the disposition of an antenna module on an electronic device according to various embodiments.

FIG. 12D is a perspective view illustrating the disposition of an antenna module 801 on an electronic device 101 according to various embodiments.

Figure 12E:
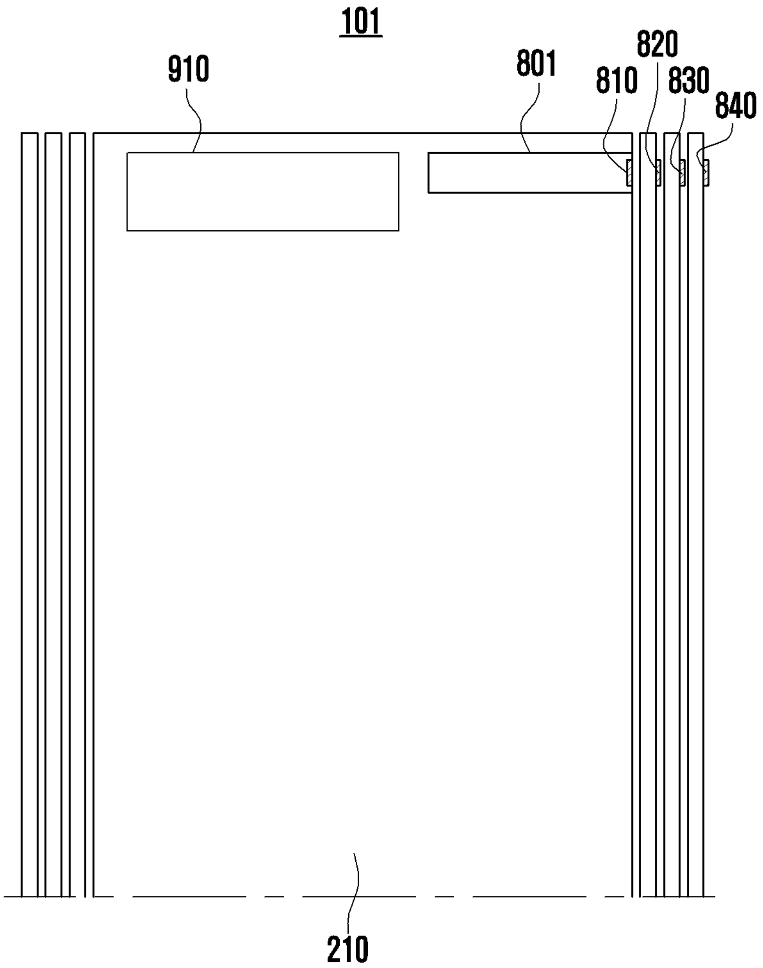
FIG. 12E is a diagram illustrating a side view illustrating the disposition of an antenna module on an electronic device according to various embodiments.

FIG. 12E is diagram illustrating a side view illustrating the disposition of an antenna module 801 on an electronic device 101 according to various embodiments.

Referring to FIGS. 12D and 12E, the antenna module 801 of FIG. 12C may be disposed to form a beam in an x-axis direction on at least a part of the housing 210.

In case that the antenna module 801 of FIG. 12C is disposed in a direction in which a beam row is formed on at least a part of the housing 210 in FIG. 12E, the antennas may be disposed in the order of the array antenna 810, the first director unit 820, the second director unit 830, or the third director unit 840. In various embodiments, the housing 210 may further include a conductor 910 that can operate as a reflector.

Figure 12F:
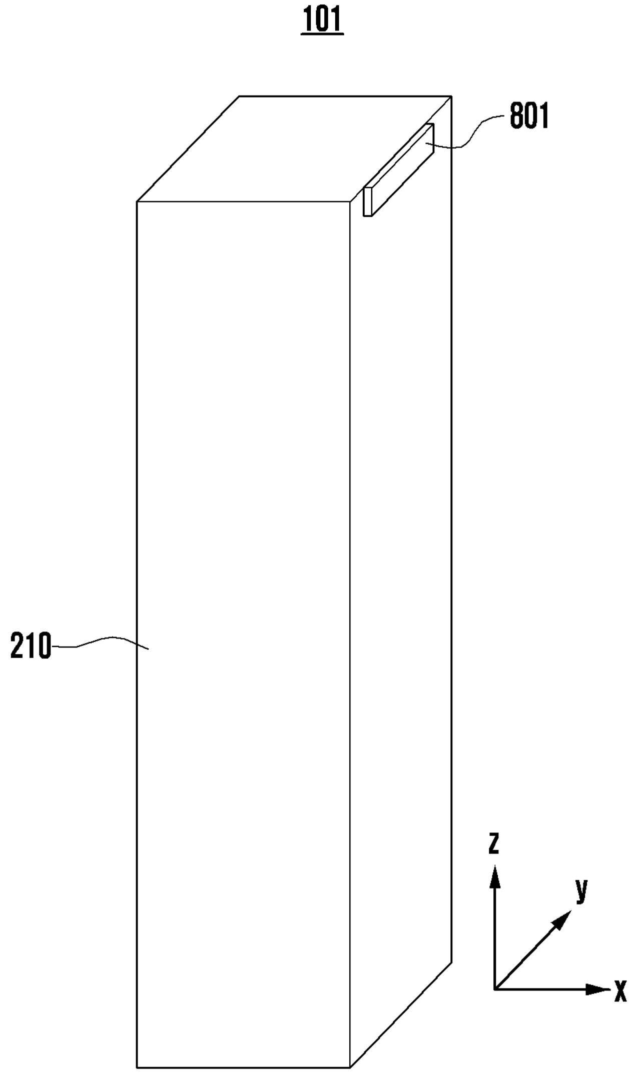
FIG. 12F is a perspective view illustrating the disposition of an antenna module on an electronic device according to various embodiments.

FIG. 12F is a perspective view illustrating the disposition of an antenna module 801 on an electronic device 101 according to various embodiments.

Figure 12G:
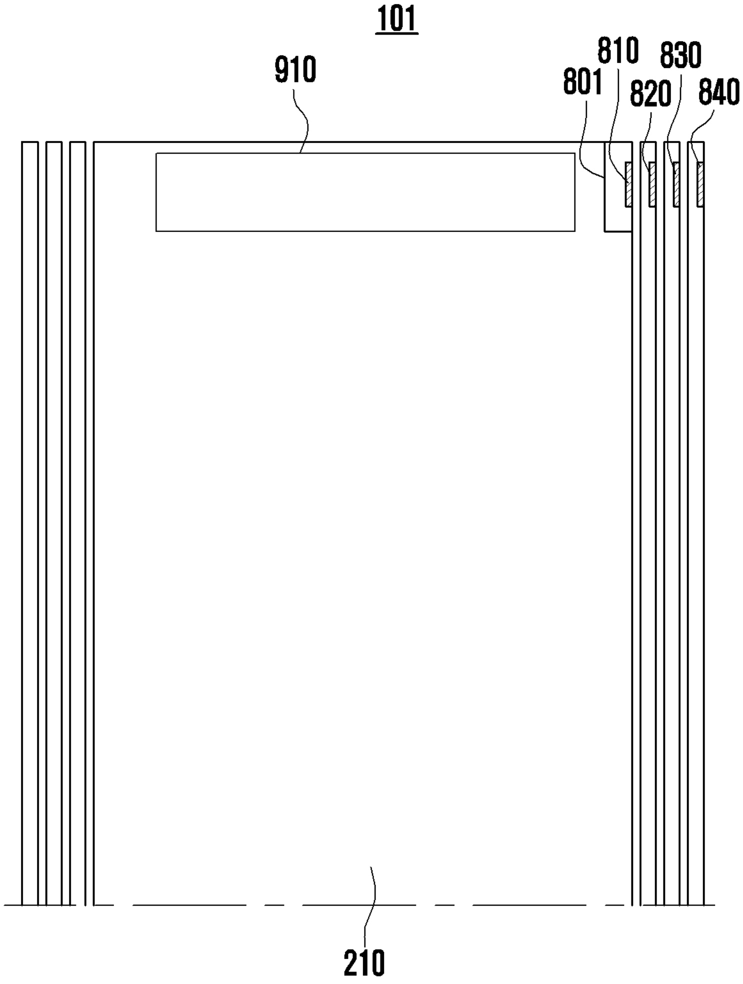
FIG. 12G is a diagram illustrating a side view illustrating the disposition of an antenna module on an electronic device according to various embodiments.

FIG. 12G is a diagram illustrating a side view illustrating the disposition of an antenna module 801 on an electronic device 101 according to various embodiments.

In FIG. 12F, the antenna module 801 of FIG. 12D may be disposed to form a beam in an x-axis direction on at least a part of the housing 210.

In case that the antenna module 801 of FIG. 12D is disposed in a direction in which a beam row is formed on at least a part of the housing 210 in FIG. 12G, the antennas may be disposed in the order of the array antenna 810, the first director unit 820, the second director unit 830, or the third director unit 840. In various embodiments, the housing 210 may further include a conductor 910 that can operate as a reflector.

Figure 13A:
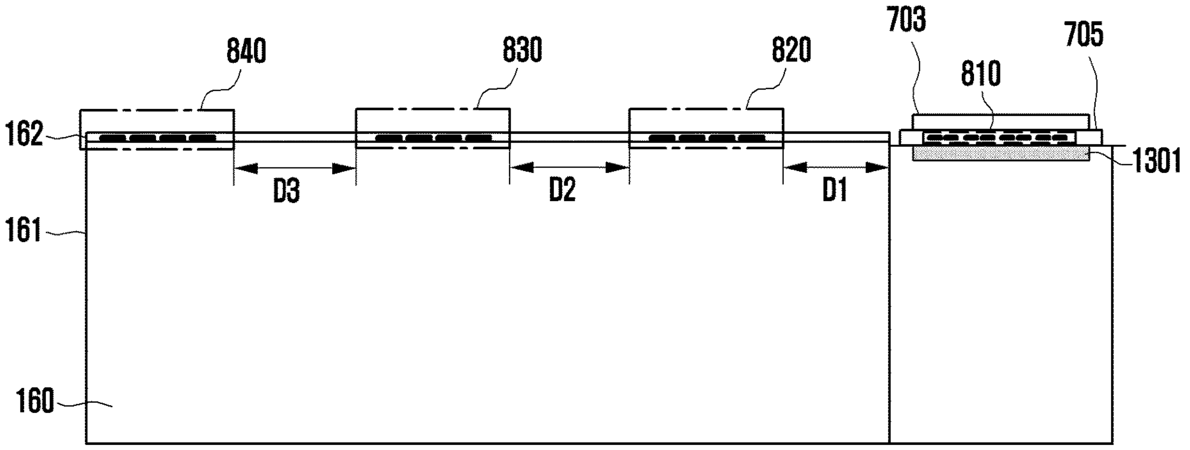
FIG. 13A is a diagram illustrating the electronic device of FIGS. 7 and 8 in case that a display module is unfolded according to various embodiments.

FIG. 13A is a diagram illustrating the electronic device 101 of FIGS. 7 and 8 in case that a display module 160 is unfolded according to various embodiments.

Figure 13B:
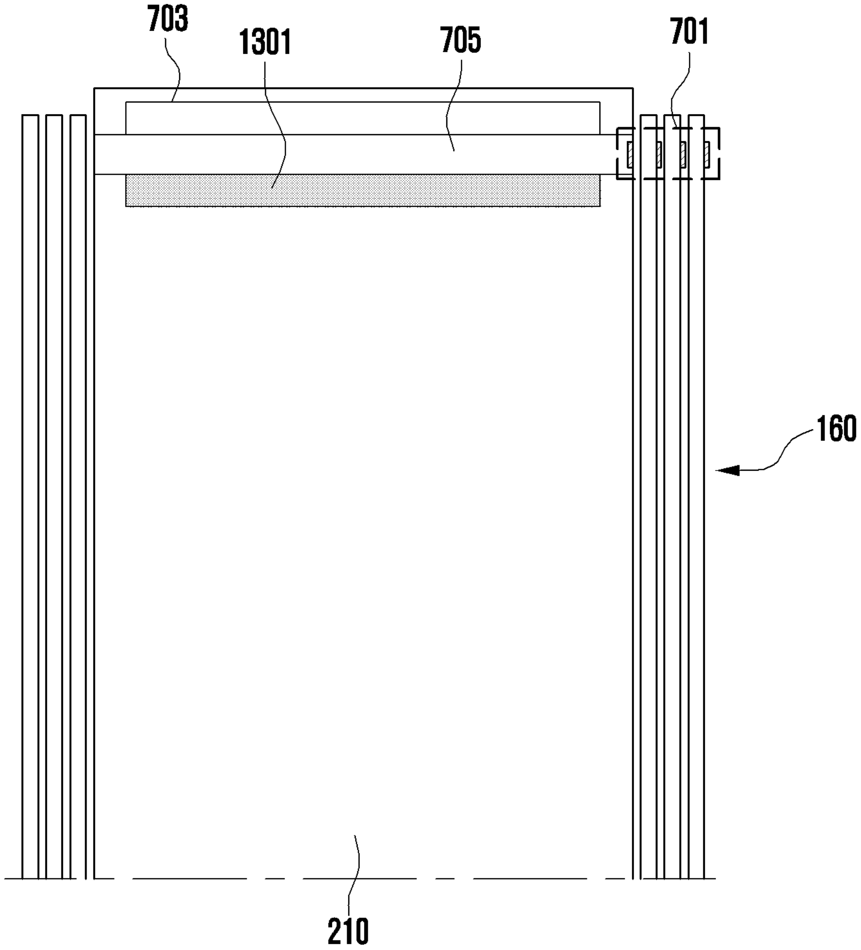
FIGS. 13B and 13C are views of the electronic device of FIGS. 7 and 8 in case that a display module is rolled.
Figure 13C:
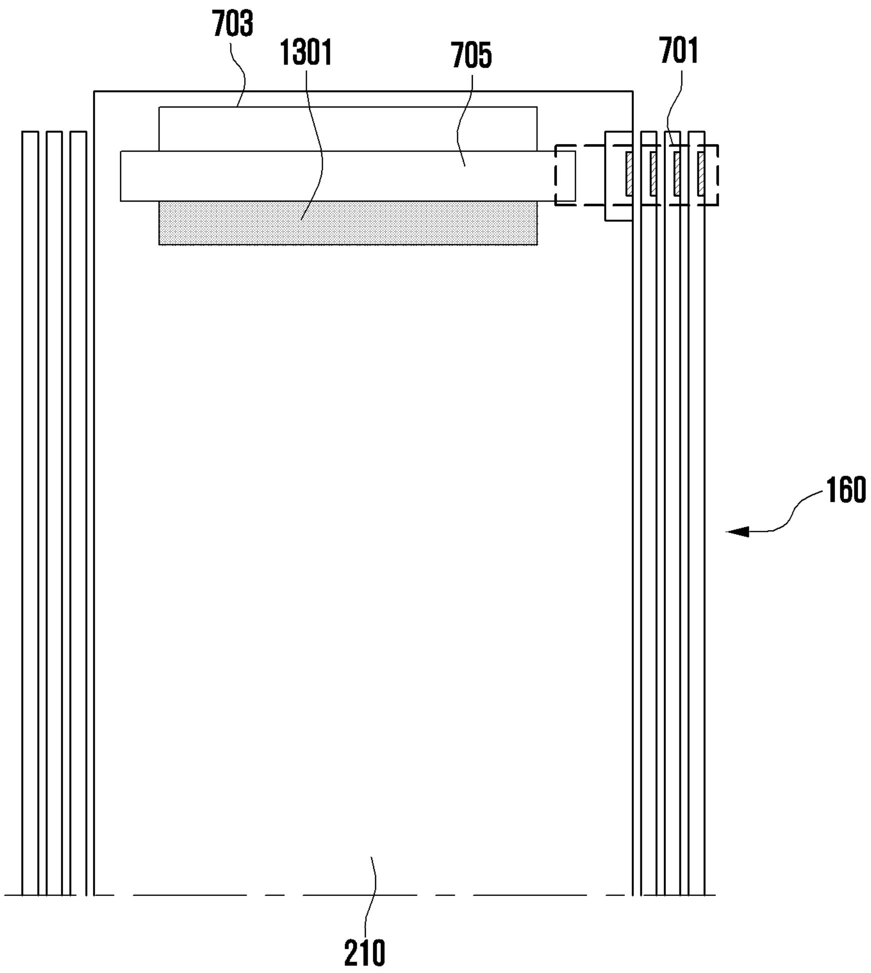

FIGS. 13B and 13C are diagrams illustrating the electronic device 101 of FIGS. 7 and 8 in case that a display module 160 is rolled according to various embodiments.

In various embodiments, the array antenna 810 may be disposed on the printed circuit board 705, and may be electrically connected to an RFIC 1301.

In various embodiments, the array antenna 810 may be implemented on a small antenna module or an antenna structure (e.g., antenna module 801), and may be connected to the printed circuit board 705, or may be implemented in an embedded manner.

Referring to FIGS. 13A, 13B and 13C, the display module 160 may include at least one director unit 820, 830, and 840 in at least a part of the bezel area 162. As a sequential disposition relationship from a director close to the housing 210, the director units may be disposed farther away from the housing 210 in the order of the first director unit 820, the second director unit 830, or the third director unit 840.

According to various embodiments, the director units 820, 830, and 840 form a set in a state where the display module 160 is wound on the housing 210, and the separation distance (second distance D2 or third distance D3) between the directors may approximate the circumference length (R1 of FIG. 3) of the housing face in a state where the display module 160 is unfolded. For example, the separation distance (first distance D1) between the first director unit 820 and the array antenna 810 may approximate the circumference length (R1 of FIG. 3) of the housing face.

If the display module 160 is unfolded from the housing 120, the array antenna 810 is not hidden by the display module 160, and thus the array antenna 810 can emit radio waves without any separate director. If the display module 160 is wound on the housing 120, the array antenna 810 can emit radio waves through the at least one director unit 820, 830, and 840 disposed on the display module 160.

Figure 14:
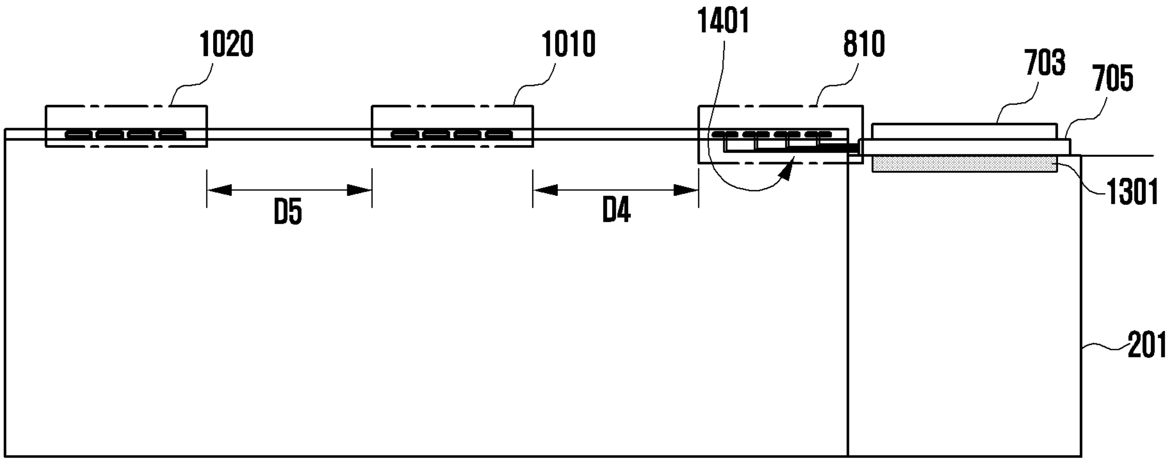
FIG. 14 is a diagram illustrating the electronic device of FIGS. 9 and 10 in case that a display module is unfolded according to various embodiments.

FIG. 14 is a diagram illustrating the electronic device 101 of FIGS. 9 and 10 in case that a display module 160 is unfolded according to various embodiments.

In various embodiments, the array antenna 810 may be disposed in at least a part of the bezel area 162 of the display module 160 and/or in at least a part of the multi-bar fixing the display module 160, and may be electrically connected to the RFIC 1301.

In various embodiments, the array antenna 810 may be electrically connected to the printed circuit board 705 using a plurality of feeding lines 1401.

In various embodiments, the display module 160 may include at least one director unit 1010 and 1020 in at least a part of the bezel area 162. For example, the director units may be disposed closer to the housing 210 in the order of the array antenna 810, the fourth director unit 1010, and the fifth director unit 1020. In an embodiment, the separation distances (fourth distance D4 and fifth distance D5) of the array antenna 810 and the director units 1010 and 1020 may approximate the circumference length (R1 of FIG. 3) of the housing face.

If the display module 160 is unfolded from the housing 120, the array antenna 810 is not hidden by the display module 160, and thus the array antenna 810 can emit radio waves without any separate director. If the display module 160 is wound on the housing 120, the array antenna 810 can emit radio waves through the at least one director unit 1010 and 1020 disposed on the display module 160.

Figure 15A:
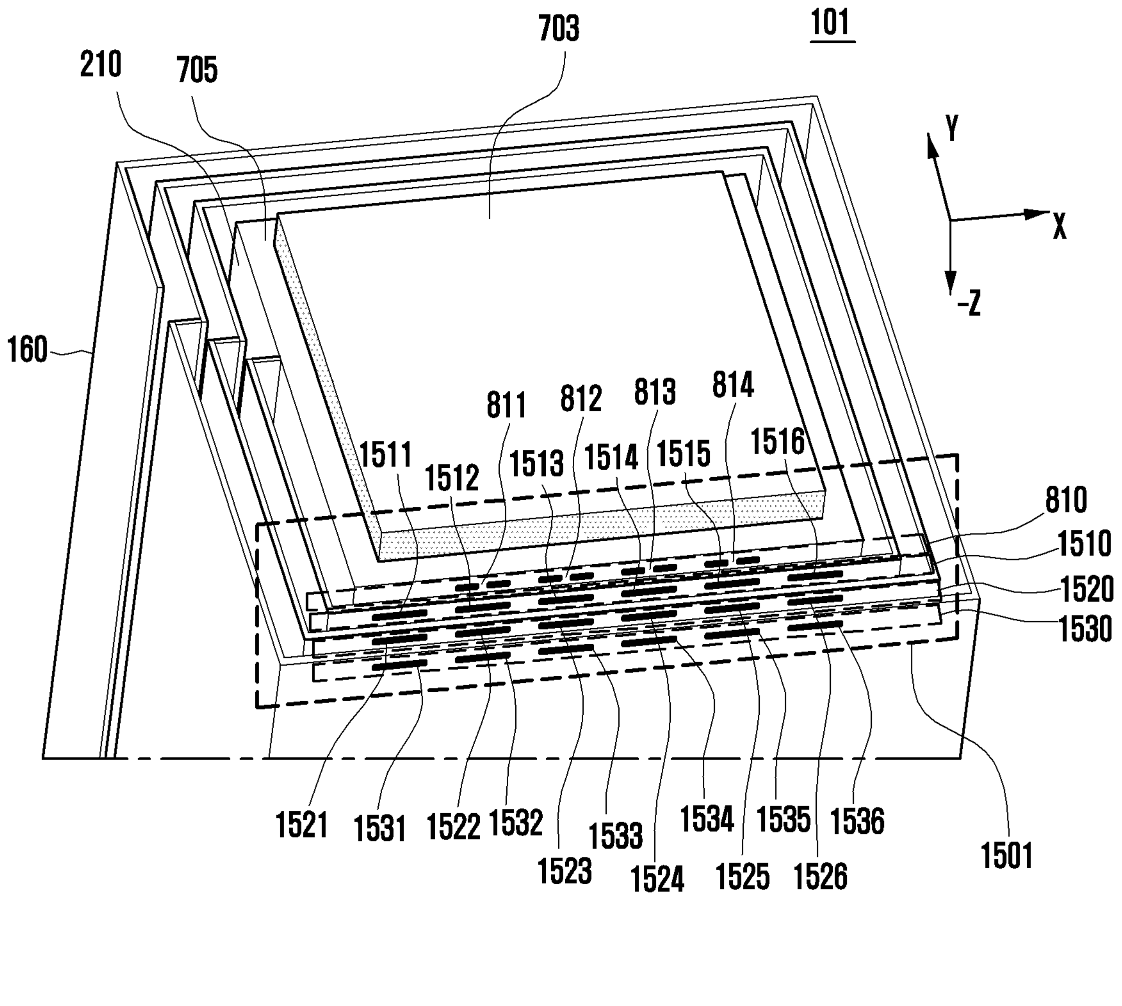
FIG. 15A is a diagram illustrating an electronic device including an antenna according to various embodiments.

FIG. 15A is a diagram illustrating an electronic device 101 including an antenna 1501 according to various embodiments.

Figure 15B:
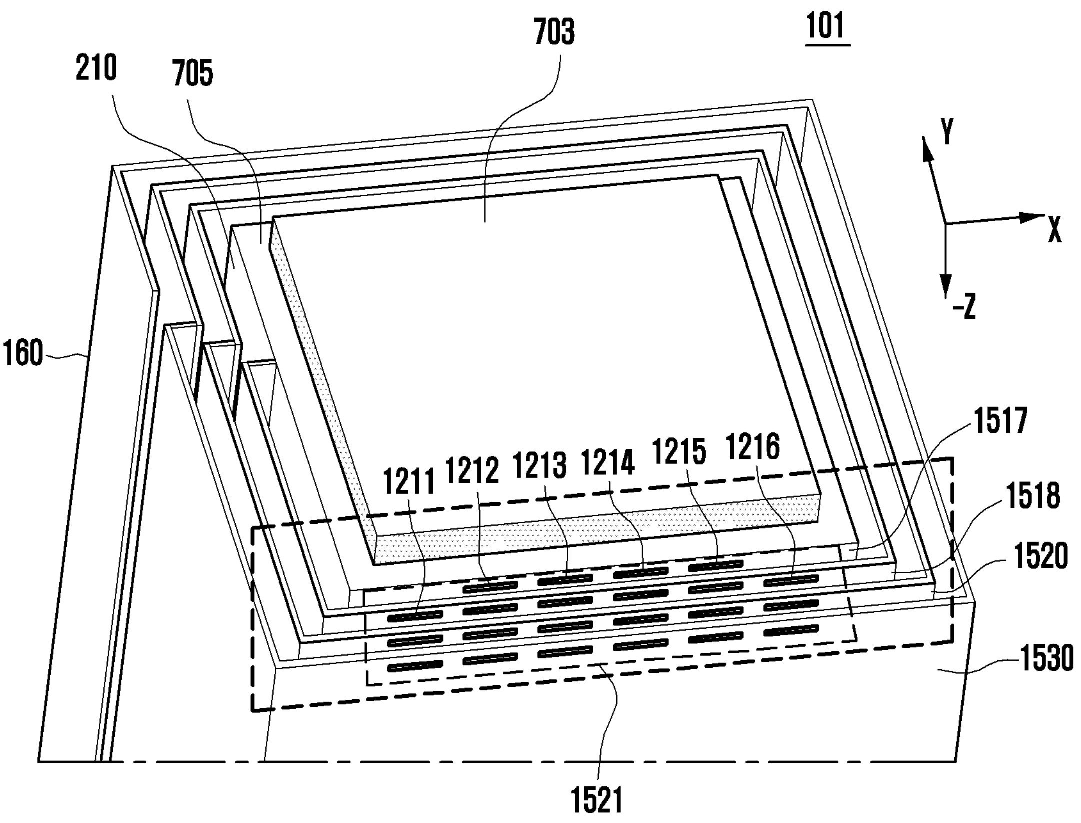
FIG. 15B is a diagram illustrating an electronic device including an antenna according to various embodiments.

FIG. 15B is a diagram illustrating an electronic device 101 including an antenna 1501 according to various embodiments of the disclosure.

In FIG. 15A, the array antenna 810 may include at least one dipole antenna 811, 812, 813, and 814. In FIG. 15B, unlike FIG. 15A, the array antenna 810 may include at least one patch antenna 811, 812, 813, and 814.

In FIGS. 15A and 15B, only at least one director unit 1510, 1520, and 1530 is differently featured, but other elements are substantially the same.

The at least one director unit 820, 830, and 840 of FIG. 7 may include the directors only in the area corresponding to the array antenna 810, whereas the at least one director unit 1510, 1520, and 1530 of FIG. 13 may further include the directors around the director area corresponding to the array antenna 810.

In various embodiments, the at least one director unit 1510, 1520, and 1530 may include the seventh director unit 1510, the eighth director unit 1520, or the ninth director unit 1530.

In various embodiments, the seventh director unit 1510 may include a 21st director 1511, a 22nd director 1512, a 23rd director 1513, a 24th director 1514, a 25th director 1515, or a 26th director 1516.

The 22nd director 1512, the 23rd director 1513, the 24th director 1514, or the 25th director 1515 may correspond to the array antenna 810, and the 21st director 1511 or the 26th director 1516 may be disposed around the 22nd director 1512, the 23rd director 1513, the 24th director 1514, or the 25th director 1515.

In various embodiments, the eighth director unit 1520 may include a 27th director 1521, a 28th director 1522, a 29th director 1523, a 30th director 1524, a 31st director 1525, or a 32nd director 1526.

The 28th director 1522, the 29th director 1523, the 30th director 1524, or the 31st director 1525 may correspond to the array antenna 810, and the 27th director 1521 and/or the 32nd director 1526 may be disposed around the 28th director 1522, the 29th director 1523, the 30th director 1524, or the 31st director 1525.

In various embodiments, the ninth director unit 1530 may include a 27th director 1531, a 28th director 1532, a 29th director 1533, a 30th director 1534, a 31st director 1535, and/or a 32nd director 1536. The 28th director 1532, the 29th director 1533, the 30th director 1534, or the 31st director 1535 may correspond to the array antenna 810, and the 27th director 1531 or the 32nd director 1536 may be disposed around the 28th director 1532, the 29th director 1533, the 30th director 1534, or the 31st director 1535.

According to various embodiments, the array antennas 810 of FIGS. 15A and 15B may be disposed in the bezel area 162 of the display module 160 as shown in FIG. 9.

Figure 16:
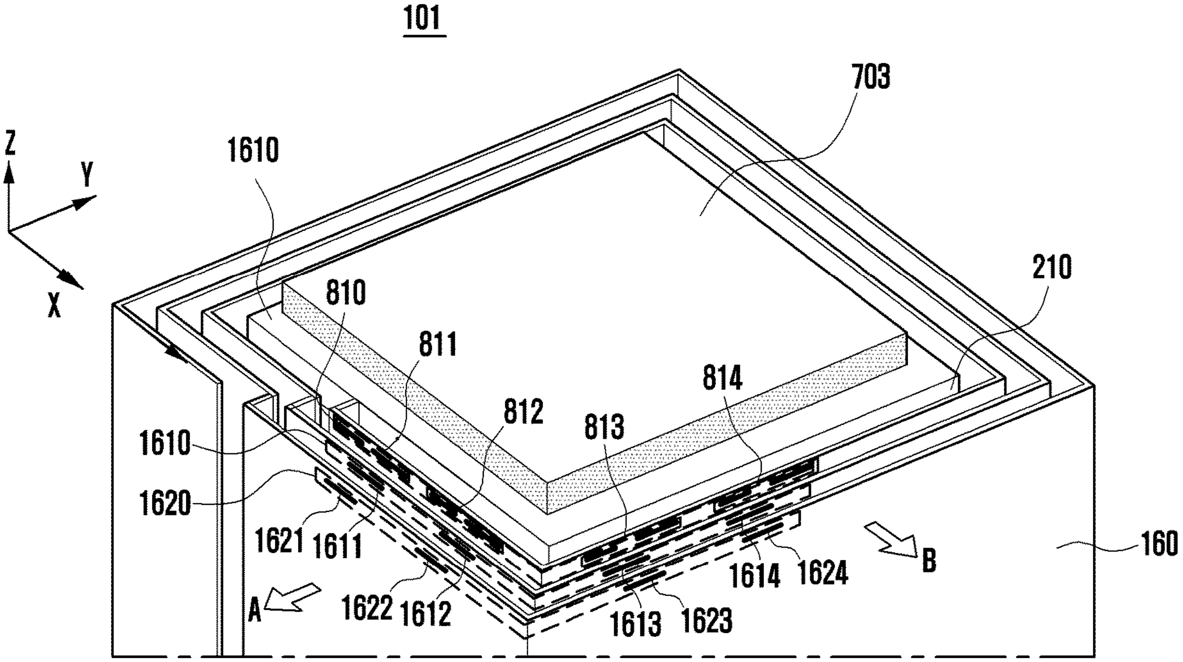
FIG. 16 is a diagram illustrating an electronic device including an antenna according to various embodiments.
Figure 17:
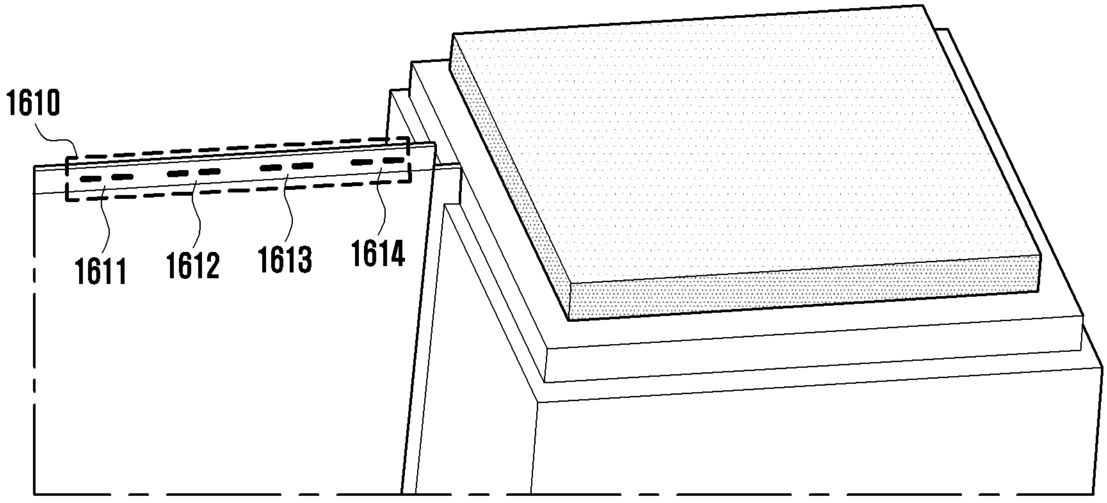
FIG. 17 is a diagram illustrating an electronic device in case that a display module of FIG. 16 is unfolded according to various embodiments.

FIG. 16 is a diagram illustrating an electronic device including an antenna 1601 according to various embodiments. FIG. 17 is a diagram illustrating an electronic device in case that a display module 160 is unfolded according to various embodiments.

In FIGS. 16 and 17, elements are substantially the same as those of FIG. 9, but the disposition relationships of the various elements may be different from each other.

In various embodiments, in the array antenna 810, the first antenna 811 and the second antenna 812 may be disposed to be directed in the first direction A, and the third antenna 813 and the fourth antenna 815 may be disposed to be directed in the second direction B. The first direction A and the second direction B may form a predetermined angle. For example, the angle formed by the first direction A and the second direction B may be 90 degrees in case that the housing (e.g., 210 of FIG. 2) is a rectangular prism, and may be 60 degrees in case that the housing (610 of FIG. 6) is a triangular prism. However, the angle formed by the first direction A and the second direction B is not limited to a specific angle, but may be changed by choice of a manufacturer.

In various embodiments, the electronic device 101 may further include a 10th director unit 1610 and an 11th director unit 1620 corresponding to the array antenna 810.

In various embodiments, in the electronic device 101, the array antenna 810 may be disposed in at least a part of the bezel area 162 of the display module 160.

In various embodiments, in the electronic device 101, the array antenna 810 may be disposed in at least a part of the multi-bar fixing the display module 160.

In various embodiments, in the display module 160, at least one director unit 1610 and 1620 may be disposed in at least a part of the bezel area 162.

In various embodiments, in the 10th director 1610, a 33rd director 1611 and a 34th director 1612 may be disposed to be directed in the first direction A, and a 35th director 1613 and a 36th director 1614 may be disposed to be directed in the second direction B.

In various embodiments, in the 11th director 1620, a 37th director 1621 and a 38th director 1622 may be disposed to be directed in the first direction, and a 39th director 1623 and a 40th director 1624 may be disposed to be directed in the second direction B.

Figure 18:
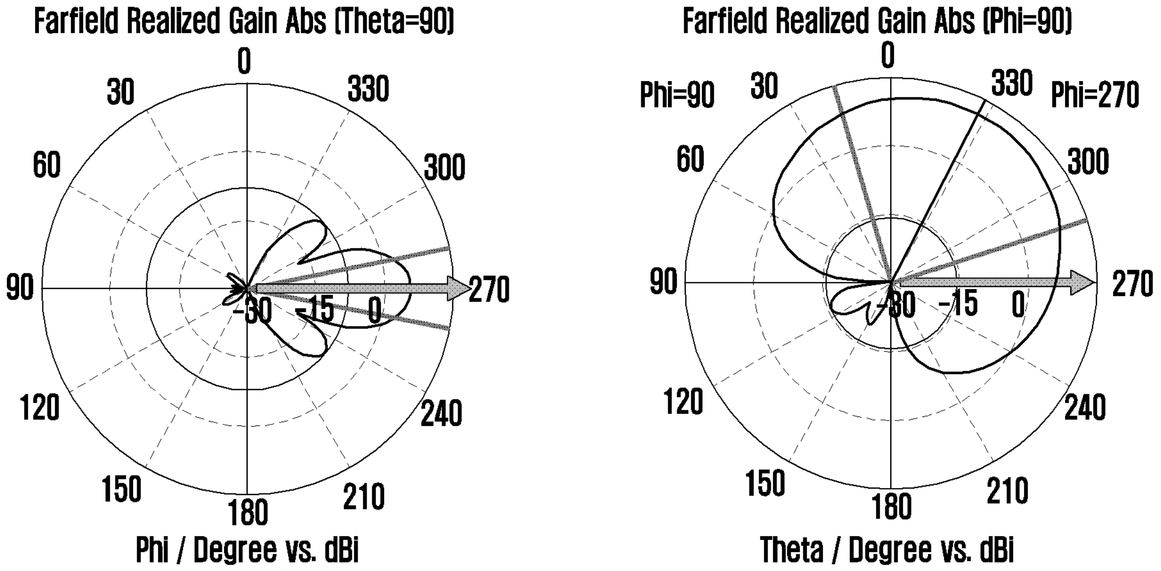
FIG. 18 is a diagram illustrating an antenna radiation pattern and an antenna gain of an array antenna of a comparative example.

FIG. 18 is a diagram illustrating an antenna radiation pattern and an antenna gain of an array antenna 810 of a comparative example.

In the array antenna of the comparative example, directors are not included in the reflector and/or the display module 160.

The reference numeral 1801 represents a radiation pattern and an antenna gain of the array antenna 810 on an x-y plane, and the reference numeral 1803 represents a radiation pattern and an antenna gain of the array antenna 810 on a y-z plane. In the reference numeral 1801, the antenna gain of the array antenna 810 disposed in −y-axis direction may be about 5.82 dBi.

Figure 19:
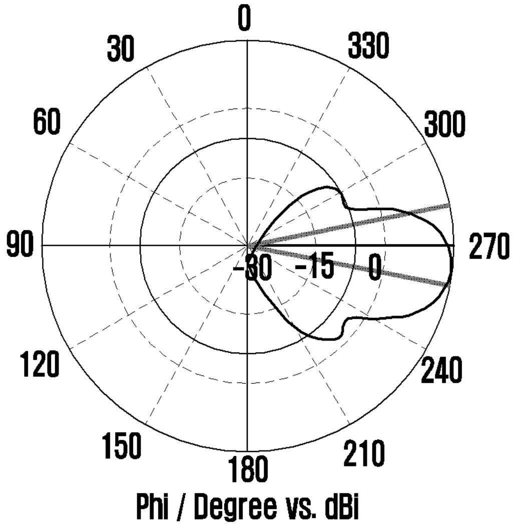
FIG. 19 is a diagram illustrating an antenna radiation pattern and an antenna gain of an electronic device including an antenna according to various embodiments.
Figure 19:
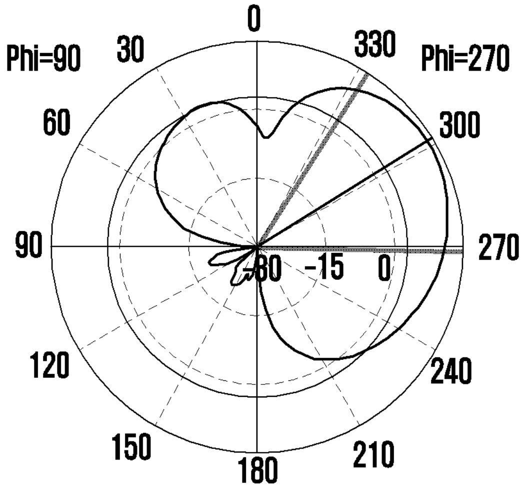

FIG. 19 is a diagram illustrating an antenna radiation pattern and an antenna gain of an electronic device 101 including an antenna structure 701 according to various embodiments.

Referring to FIG. 19, the antenna radiation pattern and the antenna gain will be described based on a case that the lengths of intervals between layers are equal to each other.

When the display module 160 is wound on the outside of the housing 210, the length of an interval between layers forming the display module 160 may be a first length G1, a second length G2, or a third length G3. The first length G1, the second length G2, or the third length G3 may be substantially the same length, and may be about 2.5 mm.

The reference numeral 1901 represents a radiation pattern and an antenna gain of the array antenna 810 on an x-y plane, and the reference numeral 1903 represents a radiation pattern and an antenna gain of the array antenna 810 on a y-z plane. In the reference numeral 1901, the antenna gain of the array antenna 810 disposed in −y-axis direction may be about 10.9 dBi.

Referring to FIGS. 19 and 18, in comparison to the comparative example, the antenna gain of the electronic device 101 including the antenna structure 701 of the disclosure can be improved over about 5 dBi.

Figure 20:
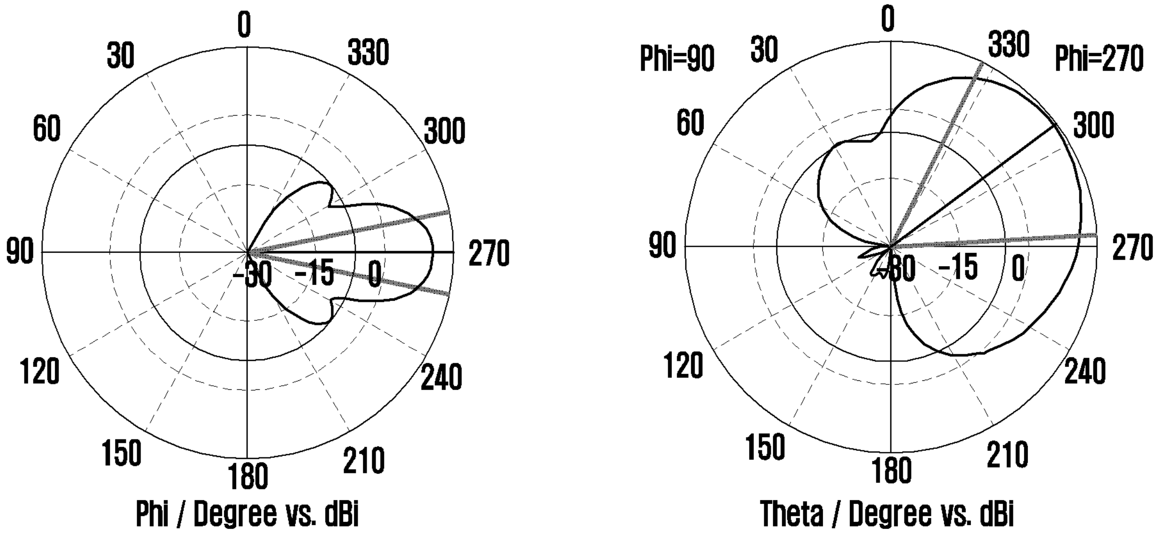
FIG. 20 is a diagram illustrating an antenna radiation pattern and an antenna gain of an electronic device including an antenna according to various embodiments.

FIG. 20 is a diagram illustrating an antenna radiation pattern and an antenna gain of an electronic device 101 including an antenna structure 701 according to various embodiments.

Referring to FIG. 20, the antenna radiation pattern and the antenna gain will be described based on a case that the lengths of intervals between layers are different from each other.

When the display module 160 is wound on the outside of the housing 210, the length of an interval between layers forming the display module 160 may be a first length G1, a second length G2, or a third length G3. The first length G1, the second length G2, or the third length G3 may be different from each other, and the first length G1 may be about 1.5 mm, the second length G2 may be about 2.5 mm, and the third length G3 may be about 3.5 mm.

The reference numeral 2001 represents a radiation pattern and an antenna gain of the array antenna 810 on an x-y plane, and the reference numeral 2003 represents a radiation pattern and an antenna gain of the array antenna 810 on a y-z plane. In the reference numeral 2001, the antenna gain of the array antenna 810 disposed in −y-axis direction may be about 10.5 dBi.

Referring to FIGS. 20 and 18, in comparison to the comparative example, the antenna gain of the electronic device 101 including the antenna structure 701 of the disclosure can be improved over about 5 dBi.

Figure 21:
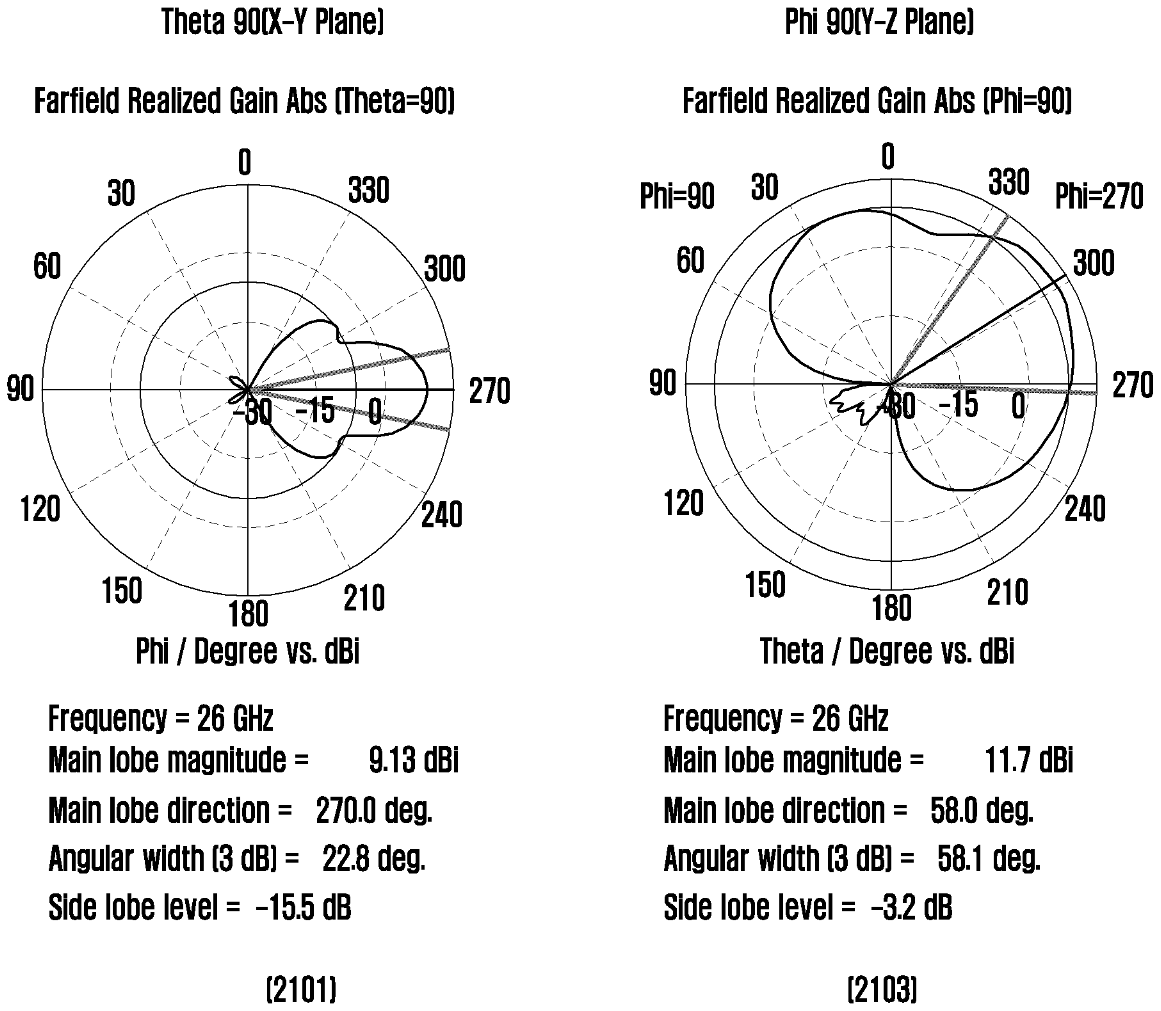
FIG. 21 is a diagram illustrating an antenna radiation pattern and an antenna gain of an electronic device including an antenna according to various embodiments.

FIG. 21 is a diagram illustrating an antenna radiation pattern and an antenna gain of an electronic device 101 including an antenna structure 701 according to various embodiments.

Referring to FIG. 21, the antenna radiation pattern and the antenna gain will be described based on a case that the lengths of intervals between layers are different from each other.

When the display module 160 is wound on the outside of the housing 210, the length of an interval between layers forming the display module 160 may be a first length G1, a second length G2, or a third length G3. The first length G1, the second length G2, or the third length G3 may be different from each other, and the first length G1 may be 3.5 mm, the second length G2 may be 2.5 mm, and the third length G3 may be 1.5 mm.

The reference numeral 2101 represents a radiation pattern and an antenna gain of the array antenna 810 on an x-y plane, and the reference numeral 2103 represents a radiation pattern and an antenna gain of the array antenna 810 on a y-z plane. In the reference numeral 2101, the antenna gain of the array antenna 810 disposed in −y-axis direction may be about 9.13 dBi.

Referring to FIGS. 21 and 18, in comparison to the comparative example, the antenna gain of the electronic device 101 including the antenna structure 701 of the disclosure can be improved over about 4 dBi.

Figure 22:
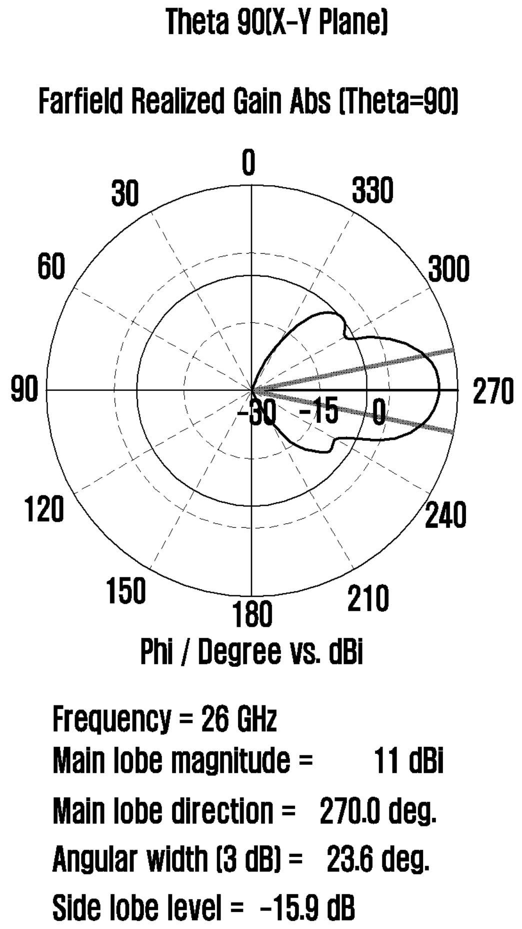
FIG. 22 is a diagram illustrating an antenna radiation pattern and an antenna gain of an electronic device including an antenna according to various embodiments.
Figure 22:
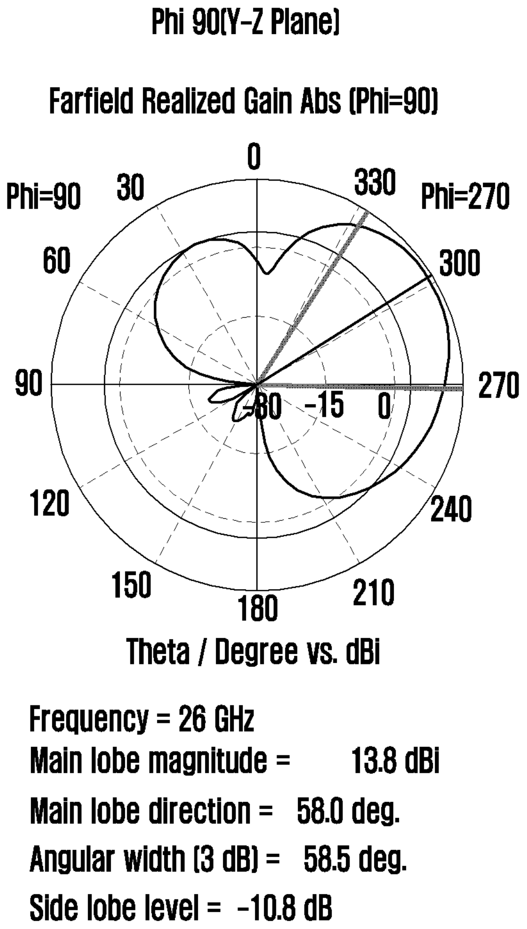

FIG. 22 is a diagram illustrating an antenna radiation pattern and an antenna gain of an electronic device 101 including an antenna structure 701 according to various embodiments.

Referring to FIG. 22, the antenna radiation pattern and the antenna gain will be described based on a case that the lengths of intervals between layers are substantially equal to each other.

When the display module 160 is wound on the outside of the housing 210, the length of an interval between layers formed by the display module 160 may be a first length G1, a second length G2, or a third length G3. The first length G1, the second length G2, or the third length G3 may be substantially the same length, and may be about 2.5 mm.

FIG. 22 shows a case that the first director unit 820 has an alignment deviation of about 0.5 mm from the array antenna 810, the second director unit 830 has an alignment deviation of about 0.5 mm from the first director unit 820, and the third director unit 840 has an alignment deviation of about 0.5 mm from the second director unit 830. For example, the second director unit 830 may have an alignment deviation of about 1 mm from the array antenna 810, and the third director unit 840 may have an alignment deviation of about 1.5 mm from the array antenna 810. The alignment deviation may be a deviation in case that the first director unit 820, the second director unit 830, and/or the third director unit 840 are not aligned in a forward direction on the array antenna 810, but are aligned to be pushed at a predetermined interval.

The reference numeral 2201 represents a radiation pattern and an antenna gain of the array antenna on an x-y plane, and the reference numeral 2203 represents a radiation pattern and an antenna gain of the array antenna on a y-z plane. In the reference numeral 2201, the antenna gain of the array antenna disposed in −y-axis direction may be about 11 dBi.

Referring to FIGS. 22 and 18, in comparison to the comparative example, the antenna gain of the electronic device 101 including the antenna structure 701 of the disclosure can be improved over about 6 dBi.

Figure 23:
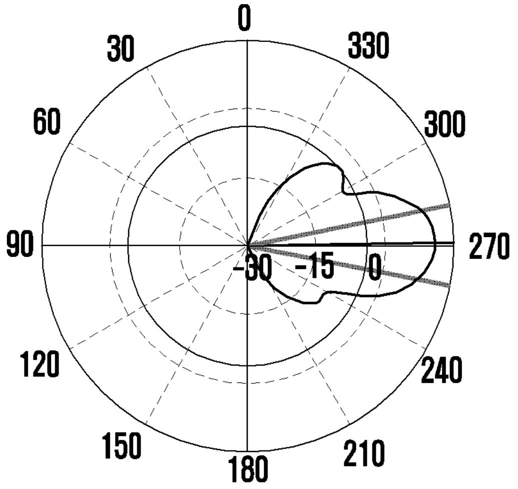
FIG. 23 is a diagram illustrating an antenna radiation pattern and an antenna gain of an electronic device including an antenna according to various embodiments.
Figure 23:
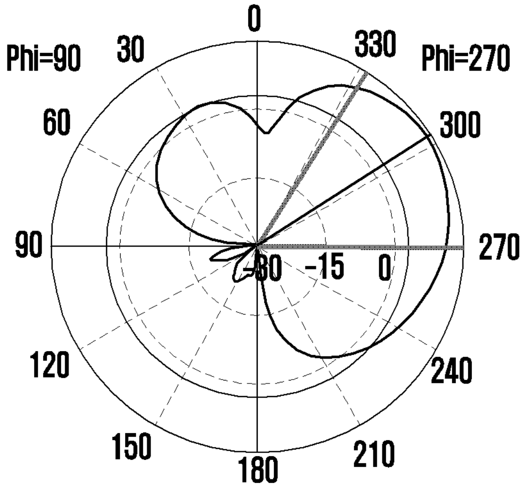

FIG. 23 is a diagram illustrating an antenna radiation pattern and an antenna gain of an electronic device 101 including an antenna structure 701 according to various embodiments.

Referring to FIG. 23, the antenna radiation pattern and the antenna gain will be described based on a case that the lengths of intervals between layers are substantially equal to each other.

When the display module 160 is wound on the outside of the housing 210, the length of an interval between layers forming the display module 160 may be a first length G1, a second length G2, or a third length G3. The first length G1, the second length G2, or the third length G3 may be substantially the same length, and may be about 2.5 mm.

FIG. 23 shows a case that the first director unit 820 has an alignment deviation of about 1 mm from the array antenna 810, the second director unit 830 has an alignment deviation of about 1 mm from the first director unit 820, and the third director unit 840 has an alignment deviation of about 1 mm from the second director unit 830. For example, the second director unit 830 may have an alignment deviation of about 2 mm from the array antenna 810, and the third director unit 840 may have an alignment deviation of about 3 mm from the array antenna 810.

The reference numeral 2301 represents a radiation pattern and an antenna gain of the array antenna on an x-y plane, and the reference numeral 2303 represents a radiation pattern and an antenna gain of the array antenna on a y-z plane. In the reference numeral 2301, the antenna gain of the array antenna disposed in −y-axis direction may be about 10.9 dBi.

Referring to FIGS. 23 and 18, in comparison to the comparative example, the antenna gain of the electronic device 101 including the antenna structure 701 of the disclosure can be improved over about 6 dBi.

The electronic devices according to various embodiments disclosed in this document may be various types of devices. The electronic device may include, for example, a portable communication device (e.g., smart phone), a computer device, a portable multimedia device, a portable medical device, a camera, a wearable device, a home appliance, or the like. The electronic devices according to embodiments of this document are not limited to the above-described devices.

It should be appreciated that various embodiments of the present disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar elements. A singular form of a noun corresponding to an item may include one or a plurality of items, unless the relevant context clearly indicates otherwise. As used in the disclosure, each of such phrases as "A or B," "at least one of A and B," "at least one of A or B," "A, B, or C," "at least one of A, B, and C," or "at least one of A, B, or C" may include all possible combinations of the items enumerated together. Such terms as "$1^{st}$," "2nd," "first," or "second" may be used to simply distinguish a corresponding component from another, and does not limit the components in other aspect (e.g., importance or order). If it is described that if an element (e.g., a first element) is referred to, with or without the term "operatively" or "communicatively", as "connected to," or "coupled to" another element (e.g., a second element), the element may be connected to the other element directly (e.g., by wire), wirelessly, or via a third element.

As used in the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments of the disclosure may be implemented as software (e.g., program 140) including one or more instructions stored in a machine-readable storage medium (e.g., internal memory 136 or external memory 138) that is readable by a machine (e.g., electronic device 101). For example, a processor (e.g., processor 120) of the machine (e.g., electronic device 101) may call at least one of one or more stored instructions from the storage media and may execute the called instructions. This enables the machine to perform at least one function in accordance with the at least one called instructions. The one or more instructions may include a code generated or executed by a complier or an interpreter. The machine-readable storage medium may be provided in the form of a non-transitory storage medium. Here, the "non-transitory" storage medium is a tangible device, and may not include a signal (e.g., electromagnetic waves), but this term does not differentiate between data semi-permanently stored in the storage medium and temporarily stored in the storage medium.

According to an embodiment, a method according to various embodiments disclosed in the disclosure may be included and provided in a computer program product. The computer program product may be traded as a product between a seller and a buyer. The computer program product may be distributed in the form of a machine-readable storage medium (e.g., compact disc read only memory (CD-ROM)), or be directly distributed online (e.g., download or upload) via an application store (e.g., Play Store™) or between two user devices (e.g., smartphones). In case of online distribution, at least a part of the computer program product may be temporarily generated or at least temporarily stored in the machine-readable storage medium, such as memory of a manufacturer's server, a server of an application store, or a relay server.

According to various embodiments, each component (e.g., module or program) of the above-described components may include a single entity or multiple entities, and some of the plurality of entities may be disposed separately from other components. According to various embodiments, one or more of the above-described corresponding components or operations may be omitted, or one or more other components or operations may be added. Alternatively or additionally, a plurality of components (e.g., modules or programs) may be integrated into a single component, and the integrated single component may still perform functions of the plurality of components in the same or similar manner as they are performed before being integrated. According to various embodiments, operations performed by the module, the program, or another component may be carried out sequentially, in parallel, repeatedly, or heuristically, or one or more of the operations may be executed in a different order or omitted, or other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:

a column-shaped housing including a processor and a communication module comprising communication circuitry disposed therein;

a rollable display wound on a column face of the housing, wherein a printed circuit board is disposed on the housing;

an array antenna mounted or embedded on the printed circuit board as a module; and a director unit including at least one director comprising a conductive material corresponding to a beam being formed by the array antenna and disposed on at least a part of the rollable display in a state in which the rollable display is wound.

2. The electronic device of claim 1, wherein the array antenna is electrically connected to a radio frequency integrated circuit (RFIC) on the printed circuit board.

3. The electronic device of claim 1, wherein the array antenna includes a dipole antenna and/or a patch antenna.

4. The electronic device of claim 1, wherein the printed circuit board further comprises a reflector.

5. The electronic device of claim 4, wherein the reflector includes a shield can.

6. The electronic device of claim 1, wherein the array antenna includes at least one antenna, and the array antenna includes at least one director.

7. The electronic device of claim 1, wherein the director unit is disposed in a bezel area of the rollable display.

8. The electronic device of claim 1, wherein the director unit and the array antenna comprise conductive portions.

9. The electronic device of claim 1, wherein the director unit further comprises at least one director on both sides of an area corresponding to the array antenna.

10. The electronic device of claim 1, wherein the rollable display forms a plurality of layers comprising concentric rings when being wound on the housing.

11. The electronic device of claim 10, wherein intervals of the plurality of layers are the same intervals or different intervals.

12. The electronic device of claim 11, further comprising at least one director disposed on the plurality of layers, respectively, and disposed to correspond to one another.

13. The electronic device of claim 12, wherein the plurality of directors disposed on the plurality of layers, respectively, correspond to one another and are aligned or correspond to one another and are not aligned.

14. The electronic device of claim 1, wherein the array antenna is disposed to be directed in a first direction.

15. An electronic device comprising:

a column-shaped housing including a processor and a communication module comprising communication circuitry disposed therein;

a rollable display wound on a column face of the housing, wherein a base of the housing includes a printed circuit board;

an array antenna disposed in a bezel area of the rollable display and/or in a multi-bar of the rollable display; and a director unit including at least one director comprising a conductive material disposed in at least a part of an area corresponding to a beam being formed by the array antenna in a state in which the rollable display is wound.

16. The electronic device of claim 15, wherein the array antenna is electrically connected to a radio frequency integrated circuit (RFIC) on the printed circuit board.

17. The electronic device of claim 15, wherein the array antenna comprises a dipole antenna and/or a patch antenna.

18. The electronic device of claim 15, wherein the director unit is disposed in a bezel area of the rollable display.

19. The electronic device of claim 15, wherein the array antenna comprises plural antennas, wherein at least some of the antennas are disposed to be directed in a first direction, at least others of the antennas are disposed to be directed in a second direction, and the first direction and the second direction forms a specified angle.

20. The electronic device of claim 15, wherein the director unit comprises plural directors, wherein at least some of the directors are disposed to be directed in a first direction, at least others of the directors are disposed to be directed in a second direction, and the first direction and the second direction form a specified angle.

* * * * *